(12) United States Patent
Takeyama

(10) Patent No.: US 6,803,514 B2
(45) Date of Patent: Oct. 12, 2004

(54) MOUNTING STRUCTURE AND MOUNTING METHOD OF A PHOTOVOLTAIC ELEMENT, MOUNTING SUBSTRATE FOR MOUNTING A SEMICONDUCTOR ELEMENT THEREON AND METHOD FOR MOUNTING A SEMICONDUCTOR ELEMENT ON SAID MOUNTING SUBSTRATE

(75) Inventor: Yoshifumi Takeyama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 10/103,821

(22) Filed: Mar. 25, 2002

(65) Prior Publication Data

US 2002/0140079 A1 Oct. 3, 2002

(30) Foreign Application Priority Data

Mar. 23, 2001 (JP) ........................................ 2001-084959
Mar. 23, 2001 (JP) ........................................ 2001-084960

(51) Int. Cl.[7] ............................................. H01L 31/048
(52) U.S. Cl. .................... 136/251; 136/244; 136/256; 136/246; 136/259; 438/64; 438/67; 438/66; 257/433; 257/503; 257/666; 257/668; 257/692; 257/701; 257/712; 257/713; 257/725; 52/173.3
(58) Field of Search ........................... 136/251, 244, 136/256, 246, 259; 438/64, 67, 66; 257/433, 503, 666, 668, 692, 701, 712, 713, 725; 52/173.3

(56) References Cited

U.S. PATENT DOCUMENTS

| | | | | |
|---|---|---|---|---|
| 5,252,141 A | | 10/1993 | Inoue et al. ................. | 136/251 |
| 5,451,813 A | * | 9/1995 | Kazutaka .................... | 257/676 |
| 5,460,659 A | | 10/1995 | Krut ............................ | 136/246 |
| 5,641,362 A | * | 6/1997 | Meier ......................... | 136/256 |
| 5,667,596 A | | 9/1997 | Tsuzuki et al. ............. | 136/256 |
| 5,679,176 A | | 10/1997 | Tsuzuki et al. ............. | 136/251 |
| 5,697,192 A | | 12/1997 | Inoue ......................... | 52/173.3 |
| 5,972,732 A | * | 10/1999 | Gee et al. ..................... | 438/66 |
| 6,162,986 A | | 12/2000 | Shiotsuka et al. .......... | 136/244 |
| 6,180,868 B1 | | 1/2001 | Yoshino et al. ............. | 136/244 |
| 6,184,457 B1 | | 2/2001 | Tsuzuki et al. ............. | 136/256 |
| 6,215,060 B1 | | 4/2001 | Komori et al. ............. | 136/251 |
| 6,271,462 B1 | | 8/2001 | Tsuzuki et al. ............. | 136/290 |
| 6,316,832 B1 | | 11/2001 | Tsuzuki et al. ............. | 257/747 |
| 6,395,972 B1 | * | 5/2002 | Tran et al. ................... | 136/251 |
| 6,664,597 B2 | * | 12/2003 | Takeyama et al. .......... | 257/347 |
| 2002/0117200 A1 | * | 8/2002 | Yoshikawa et al. ......... | 136/256 |
| 2003/0189222 A1 | * | 10/2003 | Itou et al. ................... | 257/200 |

FOREIGN PATENT DOCUMENTS

| | | |
|---|---|---|
| JP | 1978-117386 | 10/1978 |
| JP | 1983-032072 | 2/1983 |
| JP | 61-116882 A * | 6/1986 |

(List continued on next page.)

*Primary Examiner*—Alan Diamond
(74) *Attorney, Agent, or Firm*—Fitzpatrick, Cella, Harper & Scinto

(57) ABSTRACT

A mounting structure for mounting a photovoltaic element onto a metal body, which outputs a power generated by the photovoltaic element to the outside surface, and a method for mounting the photovoltaic element. In the mounting structure, the metal body has a first surface and a second surface opposite the first surface, in which the photovoltaic element is joined to the first surface and an electrically insulative material is joined to the second surface. A semiconductor element-mounting substrate for mounting a semiconductor element thereon comprising a retaining substrate having a circuit pattern, which has an electrode-joining portion for joining the semiconductor element electrode portion, an external terminal-fixing portion, and a groove between the electrode-joining portion and external-fixing portion, and a method for mounting the semiconductor element. In the mounting substrate, the electrode-joining portion is larger than the semiconductor element electrode portion.

23 Claims, 19 Drawing Sheets

FOREIGN PATENT DOCUMENTS

| | | |
|---|---|---|
| JP | 04-356947 A  * | 12/1992 |
| JP | 1993-082820 | 4/1993 |
| JP | 1995-131048 | 5/1995 |
| JP | 1995-231111 | 8/1995 |
| JP | 1996-177187 | 7/1996 |
| JP | 1997-083006 | 3/1997 |
| JP | 1999-097727 | 4/1999 |

* cited by examiner

F I G. 4
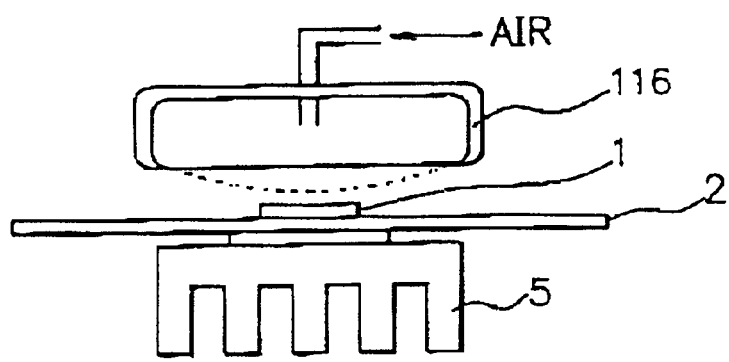

(+) ELECTRODE SIDE (−) ELECTRODE SIDE (+) ELECTRODE SIDE (−) ELECTRODE SIDE (+) ELECTRODE SIDE (−) ELECTRODE SIDE (+) ELECTRODE SIDE (−) ELECTRODE SIDE

FIG. 20(A)     FIG. 20(B)
   
FIG. 21(A)
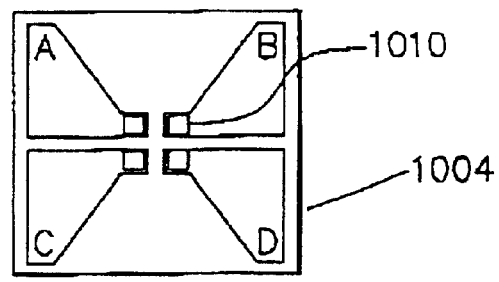
FIG. 21(B)
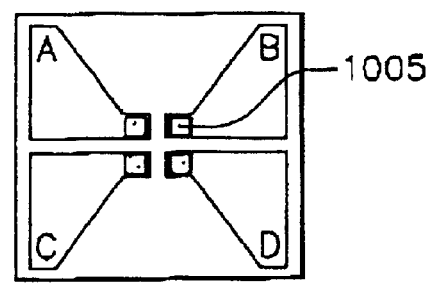
FIG. 21(C)
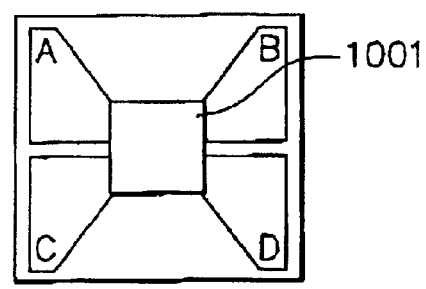

MOUNTING STRUCTURE AND MOUNTING METHOD OF A PHOTOVOLTAIC ELEMENT, MOUNTING SUBSTRATE FOR MOUNTING A SEMICONDUCTOR ELEMENT THEREON AND METHOD FOR MOUNTING A SEMICONDUCTOR ELEMENT ON SAID MOUNTING SUBSTRATE

BACKGROUND OF THE INVENTION

1. Field of the Invention

The present invention relates to a photoelectric device such as a solar cell (including a photovoltaic element), a photoelectric sensor or the like. More particularly, the present invention relates to a structure and a method for mounting a photovoltaic element. The present invention also relates to a semiconductor-element mounting substrate having a circuit pattern for a semiconductor element and which is used for mounting said semiconductor element on said substrate and a method for mounting a semiconductor element on said substrate.

2. Related Background Art

In recent years, the global warming of the earth because of the so-called greenhouse effect to an increase in the content of $CO_2$ gas in the air has been predicted.

In view of this, there is an increased demand for the development of clean energy sources with no accompaniment of $CO_2$ gas exhaustion. As one of such clean energy sources, there can be mentioned atomic power generation. However, for the atomic power generation, there are problems that are difficult to be solved, such as radioactive wastes and the like which cause air pollution. Also in view of this, there is an increased demand for providing clean energy sources which are highly safe and do not exhaust air-polluting substances.

Under these circumstances, public attention has now focused on a solar cell in which one or more photovoltaic elements are used and which converts sunlight into electric energy as a clean energy source, because it does not exhaust contaminants and it is safe and can be readily handled.

As such solar cell, there are known have a variety of solar cells. And some of them have been using as power generation sources in practice. These solar cells include crystalline series solar cells in which a single crystal silicon material or a polycrystalline silicon material is used, amorphous series solar cells in which amorphous silicon material is used, and compound semiconductor series solar cells in which compound semiconductor material is used. Besides, there are known a variety of configurations for these solar cells to be practically used. Specifically, there are known, for instance, a frame type solar cell as disclosed in Japanese Laid-open Patent Application No. 82820/1993, a frame-less type solar cell as disclosed in Japanese Laid-open Patent Application No. 131048/1995, a roofing material-integral type solar cell as disclosed in disclosed in Japanese Laid-open Patent Application No. 177187/1996or Japanese Laid-open Patent Application No. 97727/1999, and an optical-concentration type solar cell as disclosed in Japanese Laid-open Patent Application No. 83006/1997.

For any of these solar cells, the material cost of the cell (the photoelectric conversion element) constituting the solar cell accounts for the largest rate of the cost of the solar cell. Thus, in order to reduce the cost of the solar cell, it is an important factor to diminish the use amount of the material constituting the cell (the photoelectric conversion element).

The optical-concentration type solar cell is of the configuration in that in order to reduce the power generation cost by making full use of the ability of a photoelectric conversion element (a cell) used therein which is costly, sunlight is converged and condensed to several times to several hundreds times by means of a condenser lens to increase the quantity of incident light to the photoelectric conversion element, whereby diminishing the use amount of the photoelectric conversion element.

Aforementioned Japanese Laid-open Patent Application No. 83006/1997 specifically discloses a solar cell module having an optical-concentration structure in that a solar cell comprising a compound semiconductor material such as GaAs or the like is arranged on a retaining substrate constituted by glass, resin or ceramics, a reverse taper-like concaved portion whose open area being upward widened is arranged above the solar cell, and a light-converging structural body with a high refraction factor and which comprises a resin such as polystyrene and has a surface processed into a lens-like form is accommodated in said concaved portion. Separately, Japanese Laid-open Patent Application No. 231111/1995 discloses a substrate for an optical-concentration type solar cell. This substrate has a structure in that a plurality of small solar cells are connected respectively to a standard IC-type carrier comprising a dual in-line package or the like and the carriers are attached to a print substrate comprising a throughhole substrate or the like to establish electrical connection between the carriers.

FIG. 13(A) is a schematic external view illustrating an example of a conventional optical-concentration type solar power generation system comprising 20 optical-concentration type solar cell modules 115 arranged on a frame of a sun-chasing apparatus 109. FIG. 13(B) is a schematic cross-sectional view taken along the B–B' line in FIG. 13(A), illustrating the structure of one of the 20 optical-concentration type solar cell modules 115. FIG. 14 is a schematic diagram illustrating the configuration of neighborhood of given photovoltaic elements 100 in the light receiving face side of the solar power generation system shown in FIGS. 13(A) and 13(B), when viewed from above. In FIGS. 13(A), 13(B) and 14, reference numeral 100 a photovoltaic element, reference numeral 101 a circuit board, reference numeral 102 a silver paste, reference numeral 103 a heat sink, reference numeral 104 a circuit pattern, reference numeral 106 a power output electrode, reference numeral 108 a power output lead wire, reference numeral 108' a power output cable, reference numeral 109 a sun-chasing apparatus and reference numeral 110 a Fresnel lens.

Particularly, the optical-concentration type solar power generation system shown in FIGS. 13(A) and 13(B) and FIG. 14 is configured in that the 20 optical-concentration type solar cell modules 115 are arranged on the frame of the sun-chasing apparatus 109 to establish a solar cell module array in which the 20 optical-concentration type solar cell modules 115 are arrayed in an arrangement comprising 5 rows×4 columns, each row comprising 4 of the solar cell modules and each column comprising 5 of the solar cell modules. The sun-chasing apparatus 109 is provided with a driving mechanism to move the frame having the solar cell module array thereon so as to chase the sun. A power generated by the solar cell module array is outputted to the outside through the power output cable 108' connected to the power output lead wires 108 extending from the solar cell modules 115.

As will be understood with reference to FIG. 13(B) and FIG. 14, each optical-concentration type solar cell module 115 is provided with a photovoltaic element 100 mounted on a circuit board 101 through a pair of circuit patterns 104 provided on the circuit board 101, a Fresnel lens 110 in order to converge incident sunlight to the photovoltaic element 100, and a heat sink 103 in order to cool the photovoltaic element 100. The two circuit patterns 104 are provided respectively with an electrode 106 to which the power output lead wire 108 is connected so that a power generated by the photovoltaic element 100 is outputted to the outside. The circuit board 101 is fixed to the heat sink 103 through a silver paste 102, Description will be made of the photovoltaic element 100 used in the optical-concentration type solar cell module 115 and the method of mounting the photovoltaic element on the circuit board 101 with reference to FIG. 15 [FIGS. 15(A) to 15(D)], FIG. 16 [FIGS. 16(A) to 16(D)] and FIG. 17 [FIGS. 17(A) to 17(C)].

FIG. 15(A) is a schematic external view illustrating an example of a single-crystal photovoltaic element used in the optical-concentration type solar cell module, when viewed from the light receiving face side. FIG. 15(B) is a schematic cross-sectional view, taken along the line C–C' in FIG. 15(A). FIG. 15(C) is a schematic cross-sectional view, taken along the line D–D' in FIG. 15(A). FIG. 15(D) is a schematic view illustrating the configuration of the back side (the non-light receiving face side) of the photovoltaic element shown in FIG. 15(A).

In FIGS. 15(A) to 15(D), reference numeral 121 indicates of a photovoltaic element comprising a single-crystal material and which is in a square form of 12 mm×12 mm and has a thickness of 125 $\mu$m. The photovoltaic element 121 has a light receiving face provided with a reflection preventive film and which has a textured structure. The photovoltaic element 121 is provided with a pair of power output electrodes 122 and 123 at the non-light receiving face. Each of the power output electrodes 122 and 123 comprises a 10 $\mu$m thick Al electrode deposited with an Au film having a thickness of about 0.01 $\mu$m. The power output electrodes 122 and 123 are electrically connected respectively to the p-type electrode layer and the n-type electrode layer of the photovoltaic element 121.

Incidentally, for the optical-concentration type solar cell module, there is a demand that incident sunlight which is converged at a high concentration is efficiently irradiated to the photovoltaic element provided therein. In order to comply with this demand, there is known a manner that the active area of the photovoltaic element is enlarged so as to approximate 100% as much as possible by providing the power output electrodes at the non-light receiving face of the photovoltaic element. In order to make the photovoltaic element in this way, there is known a structure in that the photovoltaic element is mounted on a retaining substrate comprising a glass material, a resin material, or a ceramic material.

In the following, description will be made of an example of such structure with reference to FIG. 16 [FIGS. 16(A) to 16(D)] and FIG. 17 [FIGS. 17(A) to 17(C)].

In FIG. 16(A), reference numeral 101 indicates a circuit board which is provided with a pair of prescribed circuit patterns 104. In general, the circuit board 101 comprises a retaining substrate having a thickness of 0.5 mm to about 1 mm, and a pair of circuit patterns 104 comprising a material having a low electric resistance and which have a thickness of 0.01 mm to about 1 mm are formed. Specifically, in this case, the circuit board 101 comprises a square-shaped member made of a Al$_2$O$_3$ ceramic having a size of 25.4 mm×25.4 mm and a thickness of 0.64 mm The square-shaped member has opposite faces, one of which being joined with a 0.3 mm thick oxygen-free copper foil and the other face being joined with a 0.25 mm thick oxygen-free copper foil respectively by a DBC (direct bonding copper) method. And on the 0.3 mm thick oxygen-free copper foil on the face of the square-shaped member, a pair of circuit patterns 104 are formed. Reference numeral 105 indicates a joining material to join a photovoltaic element and a pair of power output electrodes extending from the photovoltaic element to the circuit board 101. As the joining material 105, a solder material or a carbon sheet is generally used. In this case, as the joining material 105, by means of a screen printing method using a metal plate, a cream solder material having a Su—Pb eutectic composition is applied at prescribed portions on the circuit board 101 where a pair of electrodes of the photovoltaic element which are corresponding to the foregoing pair of power output electrodes (122, 123) and the power output electrodes are arranged.

FIG. 16(B) shows an embodiment in that a photovoltaic element 100 is arranged together with a pair of power output electrodes 106 on the cream solder materials as the Joining material 105 on the circuit board 101, where the photovoltaic element 100 and the power output electrodes 106 are fixed onto the circuit board by means of the solder materials.

Now, in the case of the optical-concentration type solar cell module, as shown in FIG. 13(B), it is important that the photovoltaic element is situated at a position to oppose the Fresnel lens. For this purpose, it is required that the photovoltaic element and the circuit board, the circuit board and the housing body on which the Fresnel lens is retained, and the housing body and the Fresnel lens are arranged at proper positions in terms of the relative positional relationships., Separately, it is required for the power output electrodes 106 to make it possible to output a power generated by the photovoltaic element 100 to the outside with no resistance loss. Thus, a 0.7 mm thick oxygen-tree copper foil having a width of 15 mm and a length of 75 mm is used as each of the power output electrodes 106.

FIG. 16(C) shows an embodiment in that while maintaining the state in that the photovoltaic element 100 is arranged on the cream solder material as the joining material 105 of the circuit board 101 and the power output electrodes 106 are arranged on the circuit patterns 104 as shown in FIG. 16(B), the cream solder material is fused then cooled, whereby the photovoltaic element 100 and the power output electrodes 106 are fixed onto the circuit board 101. The heating condition to fuse the cream solder material as the joining material 105 differs depending on the composition or the like of the cream solder material. In the case where the cream solder material comprises a cream solder material having the Sn—Pb eutectic composition, it is necessary to heat the cream solder material at least for 2 to 5 seconds so that the temperature of the cream solder material becomes to be more than 195° C.

FIG. 16(D) shows an embodiment in that a further connection lead wire 108 is connected to each of the power output electrodes 106 by means of a solder or the like, for instance in order to electrically connect the optical-concentration type solar cell module involved with an adjacent optical-concentration type solar cell module. In this case, it is also required that the connection lead wire 108 is connected so that the power generated by the photovoltaic element 100 can be outputted to the outside without a resistance loss. In view of this, a copper wire having a diameter of about 3 mm and a length of about 350 mm is used as the connection lead wire 108.

FIG. 17(A) is a schematic cross-sectional view showing an embodiment in that the circuit board 101 is fixed to a heat sink 103 using a silver paste 102.

Now, in the case of the optical-concentration type solar cell module, it is required that the heat of the photovoltaic element 100 heated when converged incident sunlight at a high concentration is irradiated thereto is efficiently radiated by means of a heat radiation device such as the heat sink 103. For this purpose, it is necessary to increase the thermal conduction of the joining portion between the circuit board 101 and the heat sink 103. In view of this, it is desired to use, for example, a silver paste having a heat conductivity of more than 1 W/m·K at the joining portion. In this case, a silver paste ABLEBOND84-1 LKI-T1 (produced by Ablestik Japan Co., Ltd.) is used. And to join the circuit board 101 with the heat sink 103 by means of this silver paste is performed by applying the silver paste uniformly on the heat sink 103 by means of printing or the like at a thickness of about 0.35 mm, arranging the circuit board 101 having the photovoltaic element 100 mounted thereon on the silver paste applied on the heat sink 103 and thermosetting the silver paste for one hour by means of an oven maintained at 150° C.

FIG. 17(B) is a schematic cross-sectional elevation view illustrating an optical-concentration type solar cell module prepared in accordance with the above-described method. FIG. 17(C) is a schematic slant view of the optical-concentration type solar cell module described in FIG. 17(B).

However, in the prior art as described in the above, there are disadvantages as will be described below.

In the method of mounting the photovoltaic element which has explained with reference to FIGS. 16(A)–16(D) and FIGS. 17(A)–17(C), there is a disadvantage in that the retaining substrate on which the photovoltaic element is mounted is costly to be similar to or more than the cost of the photovoltaic element and this makes it difficult to reduce the production cost of the optical-concentration type solar cell module. There is also a disadvantage in that the method comprises the step of mounting the photovoltaic element on the retaining substrate and the step of joining the retaining substrate having the photovoltaic element mounted thereon with the heat sink by means of the silver paste, each of these steps including the heating step, and each of these steps takes a time until the stop is completed, and therefore, this unavoidably raises the production cost of the optical-concentration type solar cell module. In addition, in the step in that the retaining substrate having the photovoltaic element mounted thereon is joined with the heat sink by means of the silver paste, in order to thermoset the silver paste, the retaining substrate having the photovoltaic element mounted thereon is introduced into and kept in the oven whose inside temperature is 150° C., where there is a fear that the photovoltaic element suffers heat-rupture.

Further, in the case where the circuit board as the retaining substrate comprises a circuit board made of a ceramic, there is an occasion in that the ceramic layer in the ceramic circuit board is cracked due to the repetition of the heat treatment. When such crack portion is occurred in the circuit board, the heat conduction of the cracked portion is extremely decreased. This entails problems such that the heat of the photovoltaic element is not sufficiently radiated, and as a result, the temperature of the photovoltaic element is increased to cause a reduction in the power generation efficiency and the photovoltaic element is sometimes deteriorated in terms of the performance. Besides, in this case, there is considered occurrence of fusion in the solder which joins the photovoltaic element with the circuit board.

Other than the above-described disadvantages, there is also a disadvantage in that batch processing is necessitated because the components are separately supplied and therefore, it is necessary to use a prescribed fabrication apparatus for the batch processing, which is relatively costly.

Additionally, for the foregoing method of mounting the photovoltaic element, there are other disadvantages as will be described below.

That is, in the mounting method shown in FIGS. 16(A)–16(D), in the case where the photovoltaic element 100 is mounted on the circuit board 101 as the retaining substrate, even when the photovoltaic element 100 is accurately arranged at a prescribed position of the circuit board 101 by way of picture processing, there is an occasion in that when the cream solder material 105 is fused, part of the cream solder material and part of the flux contained in the cream solder material are issued to displace the position of the photovoltaic element 100.

Now, for a photovoltaic element used in the optical-concentration type solar cell module, the thickness thereof is required to be very thin to be, for instance, 150 µm or less for the reason that sunlight which is impinged from the light receiving face of the photovoltaic element is necessary to irradiate to the p-type electrode layer and the n-type electrode layer of the photovoltaic element which are situated in the vicinity of the power output electrodes provided at the non-light receiving face of the photovoltaic element.

In the case where such photovoltaic element is mounted on the circuit board as shown in FIGS. 16(A)–16(D), when the cream solder material 105 is fused, here is sometimes an occasion in that part of the cream solder material or/and part of the flux contained in the cream solder material are issued to deposit on the light receiving face of the photovoltaic element.

Separately, in order to perform accurate positioning for the components to be mounted on the circuit board as the retaining substrate and in order to prevent the fused cream solder material from being issued, there is known a method in that a resist comprising an epoxy resin or the like is formed on the circuit board. However, in the optical-concentration type solar cell module, incident sunlight is converged and condensed to be several times to several hundreds times by means of a condenser lens and because of this, there is an occasion in that the temperature of a portion of the circuit board (having the photovoltaic element mounted thereon) which receives such condensed sunlight is extremely increased to reach several hundreds centigrade (° C.). In this case, a problem is liable to occur in that the resist formed on the circuit board suffers from extreme heat deterioration or it is thermally decomposed to disappear. In addition, when the resist is thermally decomposed, foreign matter is generated to deposit on the light receiving face of the photovoltaic element.

Therefore, the method in that the resist is formed on the circuit board is not always effective.

SUMMARY OF THE INVENTION

The present invention has been accomplished as a result of extensive studies by the present inventor in order to solve the foregoing problems in the prior art.

An object of the present invention is to provide a mounting structure in which a photovoltaic element is mounted together with a metal body for outputting a power generated by said photovoltaic element to the outside, said photovoltaic element having a light receiving face and a non-light receiving face and having a pair of electrodes on said non-light receiving face, said metal body having a first surface and a second surface opposite said first surface, wherein said photovoltaic element is joined to said first surface of said metal body and an electrically insulative joining member is joined to said second surface of said metal body.

In this mounting structure, the metal body is capable of being a heat spreader which has a heat radiation function. And the metal body makes it possible to readily output a large electric current.

Another object of the present invention is to provide a method for mounting, a photovoltaic element, a metal body for outputting a power generated by said photovoltaic element to the outside, and a heat radiator for radiating heat generated in said photovoltaic element due to receipt of light irradiation by said photovoltaic element, said photovoltaic element having a light receiving face and a non-light receiving face and having a pair of electrodes on said non-light receiving face, said metal body having a first surface and a second surface opposite said first surface, said method including at least an element-joining step (a) of joining said photovoltaic element to a prescribed position on said first surface of said metal body by means of a joining material and a heat radiator-joining step (b) of joining said heat radiator to a prescribed position on said second surface of said metal body by means of an electrically insulative joining material.

This mounting method enables to realize aforesaid mounting structure in which the photovoltaic element is mounted.

A further object of the present invention is to provide a semiconductor element-mounting substrate for mounting a semiconductor element thereon, said mounting substrate comprising a retaining substrate having a circuit pattern for said semiconductor element, said circuit pattern having an electrode-joining portion for joining electrodes said semiconductor element and an external terminal-fixing portion for fixing an external terminal wherein said electrode-joining portion is electrically joined to said external terminal-fixing portion and said electrode-joining portion and said external terminal-fixing portion are respectively electrically insulated, said electrode-joining portion being formed to be greater than an electrode portion of said semiconductor element, and a groove being provided between said electrode-joining portion and said external terminal-fixing portion. Particularly, said mounting substrate comprising said retaining substrate and a lead frame joined to said retaining substrate, said lead frame having a circuit pattern for said semiconductor element, said circuit pattern having said electrode-joining portion where a pair of power output electrodes of said semiconductor element are joined and said external terminal-fixing portion which is electrically joined to said electrode-joining portion, said electrode-joining portion being formed to be greater than said electrode portion of said semiconductor element, and a groove being provided between said electrode-joining portion and said external terminal-fixing portion.

The semiconductor element-mounting substrate thus structured is greatly advantageous in that even when the semiconductor element mounted is a thin type photovoltaic element which is used under condition with irradiation of a highly condensed light, the mounting substrate makes it possible to desirably mount said photovoltaic element thereon without displacing the originally arranged position of said photovoltaic element and while preventing the cream solder material or/and the flux contained the rein from depositing on the light receiving face of photovoltaic element.

A still further object of the present invention is to provide a method for mounting a semiconductor element on a retaining substrate having a lead frame joined thereto, said method comprising: a step of forming a circuit pattern for said semiconductor element at said lead frame, said circuit pattern having an electrode-joining portion where a pair of power output electrodes of said semiconductor element are joined and an external terminal-fixing portion for a fixing an external terminal, said electrode-joining portion being electrically joined to said external terminal-fixing portion, said electrode-joining portion being capable of becoming to be in a form which is greater than an electrode portion of said semiconductor element; a step of forming a grove between said electrode-joining portion and said external terminal-fixing port on; a step of arranging a cream solder material at a prescribed position on said lead frame; a step of arranging said semiconductor element at a prescribed position on said lead frame where said cream solder material is arranged; a step of fusing said cream solder material to connect the electrodes of said semiconductor element to said lead frame; and a step of joining the lead frame having the semiconductor element mounted thereon with the retaining substrate.

BRIEF DESCRIPTION OF THE DRAWINGS

FIG. 4 is a schematic view illustrating an air bag press system used in the present invention.

FIGS. 15(A) to 15(D) are schematic views for explaining a photovoltaic element used in the conventional optical-concentration type solar cell module shown in FIG. 13(B).

FIGS. 18(A) to 118(C) are schematic views for explaining a retaining substrate for mounting a semiconductor element thereon and a state after said semiconductor element is mounted on said retaining substrate in Example 6 which will be described later.

FIGS. 20(A) and 20(B) are schematic views for explaining a semiconductor element used in Example 7 which will be described later.

FIGS. 21(A) to 21(C) are schematic views for explaining a retaining substrate for mounting a semiconductor element thereon and a state after said semiconductor element is mounted on said retaining substrate in Example 7 which will be described later.

DESCRIPTION OF THE INVENTION AND PREFERRED EMBODIMENTS

Figure 1A:
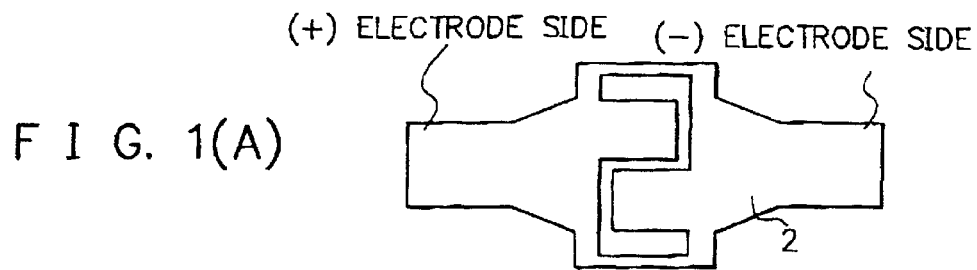
FIGS. 1(A) to 1(D) re schematic views for explaining a mounting structure of a photovoltaic element and a method for mounting said photovoltaic element in Example 1 which will be described later.

As previously described, the present invention includes two aspects, a first aspect including a mounting structure of a photovoltaic element and a method for mounting a photovoltaic element, and a second aspect including semiconductor element-mounting substrate for mounting a semiconductor element thereon and a method for mounting a semiconductor element on a retaining substrate having a lead frame joined thereto.

In the following, description will be made of each of said first aspect and said second aspect.

First Aspect

The first aspect of the present invention provides a mounting structure in which a photovoltaic element is mounted together with a metal body for outputting a power generated by said photovoltaic element to the outside, said photovoltaic element having a light receiving face and a non-light receiving face and having a pair of electrodes on said non-light receiving face, said metal body having a first surface and a second surface opposite said first surface, wherein said photovoltaic element is joined to said first surface of said metal body and an electrically insulative joining member is joined to said second surface of said metal body.

In this mounting structure, the metal body is capable of being a heat spreader which has a heat radiation function. And the metal body makes it possible to readily output a large electric current. The metal body in the mounting structure is necessary to be electrically divided for each of the electrodes of the photovoltaic element. The metal body can be electrically divided into a plurality of electrodes, for instance, by a manner of fixing the metal body having the photovoltaic element mounted thereon onto a heat radiator and cutting part of the metal body. In this case, the electrically insulative joining member joined to the second surface of the metal body functions to ensure the inter-electrode electric insulation of the electrically divided electrodes.

The metal body is preferred to comprise an electrically conductive metallic material principally comprising a metal selected from the group consisting of Au, Ag, Cu, Al, Ni, Fe, Co, and W or an alloy thereof. In this case, the metal body has a high conductivity and is capable of desirably functioning as an externally power-outputting electrode.

Particularly, for instance, in the case of a photovoltaic element used in the optical-concentration type solar cell, an electric current of more than 1 Å is generated. Therefore, for the power output electrode used in order to output a power generated by the photovoltaic element to the outside, it is required to have such a high conductivity that an electric resistance loss becomes to be less than 5%. Thus, the power output electrode is necessary to comprise a material having a high conductivity and have a sufficient cross section. In this respect, such constitution as above described is preferred.

Further, it is preferred that the metal body is shaped in a plate-like form having a thickness in a range of from 0.05 to 2 mm.

In thin case, the metal body functions also as a desirable support member for the photovoltaic element.

Particularly, in the case where the photovoltaic element used in the optical-concentration type solar cell comprises a thin type photovoltaic element, the thin type photovoltaic element is required to have such support member to retain the photovoltaic element.

The metal body has a thickness in a range of 0.05 to 2 mm and rigidity such that it can function also as a support member to retain the photovoltaic element. In the case where the thickness of the metal body is excessively thick such that it is beyond 2 mm, in the practical use of the metal body after it is joined with the photovoltaic element, there is an occasion in that peeling is occurred at the interface between the metal body and the photovoltaic element due to a difference in their expansion coefficients to entail faults such as cracking and the like in the photovoltaic element.

The metal body is preferred to be shaped in a form such that a plurality of photovoltaic elements can be mounted on the same frame thereof. In this case, it is possible that after a metal body in a roll form and having a prescribed pattern is continuously supplied and a plurality of photovoltaic elements are continuously mounted on the metal body, the metal body is out to have individual frame parts each have a plurality of photovoltaic elements mounted thereon. In this case, by forming notches or holes at an end portion of the metal body in the longitudinal direction at an equal interval corresponding to a delivery structure of a mounting apparatus, the continuous production thereof becomes possible and the throughput is improved, resulting in a reduction in the production cost. As the mounting apparatus, any of the conventional mounting apparatus can be used.

It is preferred that the electrical connection of the photovoltaic element land the metal body is performed by means of a joining material containing a metal selected from the group consisting of Sn. Pb, Ag and Cu. In this case, the joining of the electrode of the photovoltaic element with the metal body can be conducted so as to have high reliability and high conductivity by a relatively simple joining method wherein a joining material paste containing such metal filler as above described is supplied and the joining paste supplied is subjected to a heat treatment or a thermosetting treatment.

The foregoing electrically insulative joining material is desired to contain an adhesive having a heat conductivity. The electrically insulative joining material functions to ensure the insulation between the metal body and the heat radiator. It is necessary that the heat generated in the photovoltaic element is efficiently transferred to the heat radiator. In the case where the electrically insulative joining material contains the adhesive having a heat conductivity, the joining of the metal body having the photovoltaic element mounted thereon and the heat radiator can be readily performed for a short period of time. This makes it possible to simplify the mounting step.

In a preferred embodiment, the electrically insulative joining material comprises an insulative double-coated adhesive sheet having a heat conductivity. In this case, it is not necessary to independently provide an insulative member for the metal body having the photovoltaic element and the heat radiator which is usually made of a metallic material. Thus, a relatively simple photovoltaic element-mounted structure can be attained.

The foregoing second surface of the metal body is preferred to be joined to the heat radiator through the electrically insulative joining material. In this case, the heat radiation efficiency is markedly improved.

The heat radiator is preferred to have a form having at least a flat face. In this case, the forgoing joining by means of the insulative double-coated adhesive sheet can be readily performed.

The heat radiator may comprise an air-cooling equipment such as a heat sink which is relatively inexpensive. In this case, a relatively simple photovoltaic element-mounted structure which is trouble-free can be attained.

Further, the heat radiator is preferred to be shaped in an elongated form capable of mounting at least two photovoltaic elements thereon. In this case, the elongated heat radiator is capable of serving as a support to retain the metal body comprising the foregoing frame part having the plurality of photovoltaic elements mounted thereon. Thus, the handling is relatively easy in the case of making a plurality of photovoltaic elements to be one unit.

The first aspect of the present invention also provides a method for mounting a photovoltaic element. Particularly, the method is for mounting a photovoltaic element, a metal body for outputting a power generated by said photovoltaic element to the outside, and a heat radiator for radiating heat generated in said photovoltaic element due to receipt of light irradiation, said photovoltaic element having a light receiving face and a non-light receiving face and having a pair of electrodes on said non-light receiving face, said metal body having a first surface and a second surface opposite said first surface, said method including at least an element-joining step (a) of joining said photovoltaic element to a prescribed position on said first surface of said metal body by means of a joining material a d a heat radiator-joining step (b) of joining said heat radiator to a prescribed position on said second surface of said metal body by means of an electrically insulative joining material. The method enables to realize aforesaid photovoltaic element-mounted structure.

The element-joining step (a) is preferred to include at least a step (a-i) Of arranging the joining material at a prescribed position on the first surface of the metal body, a step (a-ii) of arranging the photovoltaic element at a prescribed position on the metal body where the joining material is arranged, and a step (a-iii) of heating the joining material to join the metal body and the photovoltaic element by the joining material.

The heat radiator joining step (b) is preferred to include at least a step (b-i) f arranging the electrically insulative joining material at a prescribed position on the heat radiator, a step (b-ii) of arranging the metal body having the photovoltaic element joined thereto on the electrically insulative joining material arranged at the prescribed position on the heat radiator such that the second surface of the metal body is in contact with the electrically insulative joining material, and a step (b-iii) of pressing from above the front face of the photovoltaic element to join the metal body and the heat radiator through the electrically insulative joining material.

In the mounting method comprising the above-described steps, appropriate conventional mounting apparatus such as a dispenser, a screen printing machine, a chip mountor, a reflow furnace and the like can be used in combination.

In the mounting method, it is preferred that a lead frame is used as the metal body, and the element-joining step (a) includes a step of continuously supplying said lead frame and joining a plurality of photovoltaic elements to the lead frame continuously supplied at an equal interval and a step of cutting the lead frame into individual frame units. According to this method, the process of mounting the photovoltaic element onto the metal body can be remarkably simplified. And because the lead frame as the metal body is continuously supplied while intermittently joining the photovoltaic element to the lead frame as the metal body which is continuously supplied, it is possible to comply with a demand for the mass production. Further, by forming notches at an end portion of the lead frame as the metal body in the longitudinal direction at an equal interval corresponding to a carriage system of a chip mountor, it is possible to establish a mounting process capable of performing a conveyance while continuously performing a step of printing or dispensing the joining material, a step of mounting by the chip mounting apparatus and a step of reflowing the joining material by the reflow furnace. As the apparatus used in this case, any of those generally available at a reasonable cost can be used. Thus, it is not necessary to use specific apparatus which are costly. This results in a reduction in the production cost.

The forgoing step (b-iii) in the heat radiator-joining step (b) may be performed by using an appropriate pressing means. As a preferable specific example, there can be mentioned a structural body having a portion capable of being expanded by introducing air thereinto. By expanding said portion of the structural body in this way, the expanded portion functions to press from above the front face of the photovoltaic element to join the metal body and the heat radiator through the electrically insulative joining material. According to this method, it is possible that the metal body having the photovoltaic element mounted thereon is pressed without damaging the photovoltaic element to fix the metal body to the heat radiator through the electrically insulative joining material.

In the mounting method, it is possible that the element-joining step (a) is performed after the heat radiator-joining step (b).

In this case, the heat radiator-joining step is preferred to include at least a step of joining the heat radiator onto the second surface of the metal body through the electrically insulative joining material, and the element-joining step is preferred to include at least a step of arranging the joining material at a prescribed position on the first surface of the metal body, a step of arranging the photovoltaic element at a prescribed position on the metal body where the joining material is arranged, and a step of heating the joining material to join the metal body and the photovoltaic element by the joining material. In this method, because the element-joining step is performed after the heat radiator-joining step, it is preferred that when the photovoltaic element is mounted on the metal body and thereafter, the heat radiator is used as a support to retain the metal body and the photovoltaic element.

In the following, description of each of the photovoltaic element, the metal body, the heat radiator, and the electrically insulative joining material used in the first aspect of the present invention Photovoltaic Element:

The present invention in the first aspect is desirably applied for photovoltaic elements (including thin type photovoltaic elements) having a pair of electrodes at their non-light receiving face which are used in the optical-concentration type solar cells, but this is not limitative, it can be also desirably applied for photovoltaic elements used in other photoelectric devices such as photoelectric sensors.

As specific examples of such photovoltaic element, there can be mentioned crystalline series photovoltaic elements comprising a single crystal silicon semiconductor materials or polycrystalline silicon semiconductor materials, photovoltaic elements comprising amorphous silicon semiconductor materials, and photovoltaic elements comprising compound semiconductor materials comprising atoms belonging to groups 111 and V of the periodic table such as GaAs, AlGaAs, InP, GaInP, and the like.

In the case of the photovoltaic element having a pair of electrodes at the non-light receiving face, the thickness thereof is required to be thin such that it is 200 $\mu$m or less in order to form a p-n semiconductor junction on the non-light receiving face side. And on the non-light receiving face of the photovoltaic element, there are provided a pair of electrodes comprising a metallic material of Au, Ag, Al, Ni, Cu, or the like formed by means of a conventional technique such as vacuum deposition or sputtering, respectively electrically connected to the p-type semiconductor layer and the n-type semiconductor layer of the photovoltaic element.

The crystalline series photovoltaic element may be prepared by a conventional method such as a method wherein a wafer is quarry from a semiconductor crystal ingot and the wafer is ground or a SOI (silicon-on-insulator) method.

Metal Body:

The metal body functions as a support to retain the photovoltaic element and it also functions as an electrode in order to output a power generated by the photovoltaic element to the outside. The metal body may comprise an electrically conductive metallic material principally comprising a metal selected from the group consisting of Au, Ag, Cu, Al. Ni, Fe, Co, and W or an alloy thereof. In the case where it is necessary for the metal body to be prevented from being oxidized, a surface treatment by a metal such Au, Ag, Al, Ni, Sn, or Pb is conducted at a prescribed portion of the metal body. The metal body is required to have an excellent soldering ability and: an excellent bonding ability. Besides, it is required to have a high heat conductivity in order to release the heat generated in the photovoltaic element to the outside.

The metal body has a portion on the first surface side for mounting the photovoltaic element which is to be joined to the metal body. At said portion of the metal body, there is provided a circuit pattern formed by means of etching or die cutting which is corresponding to the electrode form of the photovoltaic element for outputting an electric current rectified or generated by the photovoltaic element to the outside of the photovoltaic element. And said portion of the metal body for mounting the photovoltaic element is shaped to agree with the flat form of the photovoltaic element.

The metal body may be shaped in a lead frame form capable of mounting a plurality of photovoltaic elements continuously supplied, for instance, in a roll form, at an equal interval on the same frame.

Further, it is necessary that the metal body is electrically divided from each electrode of the photovoltaic element. Particularly, for instance, it is necessary that after the metal body having the photovoltaic element joined thereto is fixed on the heat radiator, part of the metal body is cut off by means of a press-cutting equipment to form a plurality of electrodes which are electrically divided.

Heat Radiator:

The heat radiator functions to radiate heat generated in the photovoltaic element due to irradiation of converged and condensed sunlight.

In the optical-concentration type solar cell module, incident sunlight is converged and condensed to several times to several hundreds times by means of a condenser lens, and because of this, the temperature of the portion of the photovoltaic element where such condensed sunlight is irradiated is extremely increased to sometimes reach several hundreds centigrade (° C.). Therefore, such heat generated in the photovoltaic element is necessary to be released by the heat radiator. In order to improve the characteristics of the heat radiator, it is necessary that the wind speed on the surface of the heat radiator is heightened or the heat radiation area of the heat radiator is increased.

As specific examples of the heat radiator which satisfies these requirements, there can be mentioned a heat sink, a self-cooling device, a forced cooling device, and a water-cooling device. If necessary, it is possible to together us a heat exchanger. Of these heat radiators, the heat sink is particularly preferable because it can be produced at a reasonable cost by way of extrusion of an aluminum or copper. In addition, the head radiation area thereof can be readily increased. As the heat sink, there are known a plate type heat sink, a pin type heat sink, and a tower type heat sink. Any of these heat sinks can be used as the heat radiator Electrically Insulative Joining Material The electrically insulative joining material is required to exhibit a function to ensure the insulation between the metal body and the heat radiator and to ensure the inter-electrode insulation of the plurality of electrically divided electrodes of the metal body. The electrically insulative joining material is also required to have a high heat conductivity of more than 1 W/m·K in order to release the heat generated in the photovoltaic element.

The electrically insulative joining material which satisfies these requirement may comprise a base material and an adhesive material. The base material may be an inorganic insulative material or an organic insulative material. As specific examples of the inorganic insulative material, there can be mentioned metal oxide material such a alumina ($Al_2O_3$) and beryllias; metal nitride materials such as AlN and $Si_3N_4$; and other inorganic insulative materials represented by glass materials. As specific examples of the organic insulative material, there can be mentioned insulative resins such as epoxy resin, phenol resin, polyimide resin, polyester resin, and Teflon; and mixtures two or more of these insulative resins.

As specific examples of the adhesive material, there can be mentioned silicone resin series adhesive materials, epoxy resin series adhesive materials, and acrylic resin series adhesive materials.

Besides, the electrically insulative joining material may comprise a composite comprising a base material whose opposite surfaces are coated by an adhesive resin material containing a powder of an inorganic insulative material. As the base material in this case, there can be mentioned, for example, composites comprising a glass fiber and any of the above-mentioned insulative resins. As the adhesive resin material in this case, there can be mentioned, for example, silicone resin series adhesive materials, epoxy resin series adhesive materials, and acrylic resin series adhesive materials. As the powder in this case, there can mentioned, for example, a diamond powder having a heat conductivity of about 2000 W/m·K, a boron nitride powder having a heat conductivity of more than 600 W/m·K, a SiC powder having a heat conductivity of about 240 to 450 W/m·K, a BeO powder having a heat conductivity of about 240 to 450 W/m·K, an AlN powder having a heat conductivity of about 100 to 200 W/m·K, a $Si_3N_4$ powder having a beat conductivity of about 30 to 100 W/m·K, and an alumina ($Al_2O_3$) powder having a heat conductivity of about 20 W/m·K. Separately, in this case, in order to improve the heat conductivity, it is possible to incorporate any of these inorganic material powders into the insulative resin of the composite as the base material so that the base material has a high heat conductivity improved by more than 1 W/m·K.

Those mentioned in the above as the electrically insulative joining material are of the configuration in that the base material and the adhesive material are separately provided. Besides, the electrically insulative joining material may comprise a function-integral type insulative joining material comprising, for example, a double-coated adhesive sheet having a high heat conductivity of more than 1 W/m·K. As specific examples of such double-coated adhesive sheet, there can be mentioned adhesive sheets CHOMERICS T404 and CHOMERICS T414 having a film base member (produced by Parker Hannifin Corp.), an adhesive sheet EN500/50-2 (produced by Furukawa Denkikogyo Kabushiki Kaisha) in which the base material and the adhesive material are integrated and adhesive sheets No.9882 and No. 9885 in which the base material and the adhesive material are integrated (produced by Sumitomo 3M Kabushiki Kaisha).

Second Aspect

The second aspect of the present invention provides a semiconductor element-mounting substrate for mounting a semiconductor element thereon, said mounting substrate comprising a retaining substrate having a circuit pattern for said semiconductor element, said circuit pattern having an electrode-joining portion for joining said semiconductor element and an external terminal-fixing portion for fixing an external terminal wherein said electrode-joining portion is electrically joined to said external terminal-fixing portion and said electrode-joining portion and said external terminal-fixing portion are respectively electrically insulated, said electrode-joining portion being formed to be greater than an electrode portion of said semiconductor element, and a groove being provided between said electrode-joining portion and said external terminal-fixing portion.

Particularly, said mounting substrate comprising said retaining substrate and a lead frame joined to said retaining substrate, said lead frame having a w circuit pattern for said semiconductor element, said circuit pattern having said electrode-joining portion where a pair of power output electrodes of said semiconductor element are joined and said external terminal-fixing portion which is electrically joined to said electrode-joining portion, said electrode-joining portion being formed to be greater than said electrode portion of said semiconductor element, and a groove being provided between said electrode-joining portion and said external terminal-fixing portion.

The semiconductor element-mounting substrate thus structured is greatly advantageous in that even when the semiconductor element mounted is a thin type photovoltaic element which is used under condition with irradiation of a highly condensed light, the mounting substrate makes it possible to desirably mount said photovoltaic element thereon without displacing the originally arranged position of said photovoltaic element and while preventing the cream solder material or/and the flux contained therein from depositing on the light receiving face of the photovoltaic element.

The groove of the circuit pattern is provided at least along the circumference of the portion where the semiconductor element is mounted and also at least along the electrode-joining portion. Because of this, when the cream solder material is fused, the residual of the solder material and that of the flux contained in the solder material are introduced into the groove. This makes it possible that the surface tension of the fused solder material which floats and retains the semiconductor element is properly controlled and the semiconductor element is accurately positioned at a prescribed position of the circuit pattern. Further, since the groove of the circuit pattern is provided at an end portion of the area where the power output electrodes of the semiconductor element are joined to the electrode-joining portion of the circuit pattern, it is possible that the residual of the flux contained in the solder material which will be deposited on the light receiving surface of the semiconductor element is escaped into the clearances of the circuit pattern.

Incidentally, for instance the flux contained in a cream solder material or the like functions to remove an oxide film formed on a joined face of metallic members to improve the solder-wetting property and also functions to decrease the energy of the interface between the fused solder material and the joined metallic members and it has a heat carrier function to conduct the heat. But after the soldering, the flux is an unnecessary material and therefore, it is removed by way of washing or the like in many cases. Besides, the components of the flux contained in the cream solder material and their contents are different depending on the kind of a supply means such an dotting or metal printing adopted for supplying the cream solder material, other than the above-described functions. And there is an occasion in that the flux (including the components thereof) is significantly issued when the cream solder material is fused.

In the present invention, because the groove of the circuit pattern is provided at the end portion of the area where the power output electrodes of the semiconductor element are joined to the electrode-joining portion of the circuit pattern as above described, it is possible that the residual of the flux is escaped into the clearances of the circuit pattern.

As previously described, the semiconductor element-mounting substrate in the present invention comprises the retaining substrate and the face having at one circuit pattern and the retaining substrate is effective particularly as a retaining substrate for mounting the semiconductor element which is an insulative substrate, wherein the direction of the fused solder material to be flown can be controlled by the insulative substrate portion.

The semiconductor element-mounting substrate in the present invention can be effectively used for mounting a thin type photovoltaic element used in the optical-concentration type solar cell, wherein the mounting of the thin type photovoltaic element can be desirably performed while preventing the cream solder material or/and the flux contained therein from depositing on the light receiving face of the photovoltaic element.

The present invention is particularly effective when the thickness of a joining material used for joining the electrode-joining portion of the circuit pattern and the electrode portion of the semiconductor element is greater than $\frac{1}{3}$ of the thickness of the semiconductor element or when said joining material comprises a metallic material contains at least either Sn or Pb.

In the case where the semiconductor element-mounting substrate comprises the retaining substrate and the lead frame joined thereto, it is particularly effective that the retaining substrate is provided with a heat radiation means such as a heat sink. That is, when the lead frame having the foregoing circuit pattern is joined with the retaining substrate integrated with the heat radiation means, there can be realized a simple semiconductor element-mounted substrate structure provided with the heat radiation means.

In the present invention, in accordance with the following method for mounting a semiconductor element on the semiconductor element-mounting substrate comprising the retaining substrate and the lead frame joined to said retaining substrate, it is possible that the positioning for the semiconductor element is performed upon reflowing the cream solder material and the semiconductor element is desirably mounted on the semiconductor element-mounting substrate without a fear that the cream solder material or/and the flux contained therein are deposited on the light receiving face of the semiconductor element.

The method comprises the steps of:

(1) forming a circuit pattern for said semiconductor element at said lead frame, said circuit pattern having an electrode-joining portion where a pair of power output electrodes of said semiconductor element are joined and an external terminal-fixing portion for a fixing an external terminal, said electrode-joining portion being electrically joined to said external terminal-fixing portion, said electrode-joining portion being capable of becoming to be in a form which is greater than an electrode portion of said semiconductor element;

(2) forming a grove between said electrode-joining portion and said external terminal-fixing portion;

(3) arranging a cream solder material at a prescribed position on said lead frame;

(4) arranging said semiconductor element at a prescribed position on said lead frame where said cream solder material is arranged;

(5) fusing said cream solder material to connect the electrodes of said semiconductor element to said lead frame; and (6) joining the lead frame having the semiconductor element mounted thereon with the retaining substrate.

In the following, description will be made of each of the retaining substrate, the semiconductor element, and the circuit pattern used in the present invention.

Retaining Substrate:

The retaining substrate in the present invention functions to retain a semiconductor element which is mounted thereon. The retaining substrate may be an IC substrate, a printed circuit base board, or the like. The retaining substrate may comprise a material selected from the group consisting of alumina ($Al_2O_3$), AlN, $Si_3N_4$, beryllias, and other inorganic insulative materials represented by glass. Alternatively, the retaining substrate may comprise a material selected from the group consisting of insulative resins such as epoxy resin, phenol resin, polyimide resin, polyester resin, and Teflon, resin compositions comprising two or more of these insulative resins, and composite insulative materials comprising glass fiber and insulative resin. Besides, the retaining substrate may comprise a metal core substrate, or an iron-based enameled substrate.

The insulative retaining substrate in the present invention may be prepared in accordance with the conventional processing method or procedure adopted in processing an insulative substrate.

Incidentally, in the optical-concentration type solar cell module, incident sunlight is converged and condensed to be several times to several hundreds times by means of a condenser lens and because of this, there is an occasion in that the temperature of a given portion of the semiconductor element (that is, the photovoltaic element) which receives such condensed sunlight is extremely increased to reach several hundreds centigrade (° C.)

In this case, the retaining substrate is preferred to comprise an insulative material having excellent heat-radiating property. For instance, when the retaining substrate is constituted by an organic insulative material, it is possible to make the organic material have a high heat conductivity in a range of 1 to several tens W/m·k by incorporating a material selected from the group consisting of a diamond powder having a heat conductivity of about 2000 W/m·k, a boron nitride powder having a heat conductivity of more than 600 W/m·k, a SiC powder having a heat conductivity of about 240 to 450 W/m·k, a BeO powder having a heat conductivity of about 240 to 450 W/m·k, an AlN powder having a heat conductivity of about 100 to 200 W/m·k, a $Si_3N_4$ powder having a heat conductivity of about 30 to 100 W/m·k, and an alumina ($Al_2O_3$) powder having a heat conductivity of about 20 W/m·k into said organic insulative material.

Separately, it is possible that the retaining substrate is made to comprise an insulating ceramic substrate prepared using alumina ($Al^2O_3$), AlN, or $Si_3N_4$ while making full use of the advantages of these ceramics having high strength at normal temperature and high temperature, excellent corrosion resistance, hardly wetting property to fused metal, electrical insulation property, and high heat conductivity in accordance in accordance with technique disclosed in Japanese Laid-open Patent Application No. 117386/1978 or Japanese Laid-open Patent Application No. 32072/1983.

When the retaining substrate comprises such ceramic insulative substrate, it is possible to join a copper circuit board onto the substrate by means of DBC (direct bonding copper) method or active metal method. Besides, the substrate has high heat-radiating property, high electrical insulation property, excellent soldering property, bonding property, and copper-adhesion strength. In addition, a large silicon pellet can be directly mounted on the substrate.

In the case where the semiconductor element-mounting substrate in the present invention comprises the retaining substrate and the lead frame joined to the retaining substrate, the retaining substrate may comprise a given substrate selected from the above-mentioned substrates. As the method for joining said substrate and the lead frame, it is possible to adopt a conventional joining method such as a soldering method or the like. But, particularly in the case of the optical-concentration type solar cell module, it is preferred to adopt an appropriate joining method which excels in terms of the heat radiating property.

Separately, it is possible to make part of a heat spreader or a heat sink as the heat radiation means comprising a highly heat-conductive metal such as Al or Cu such that said part functions as the retaining substrate. In this case, it is not necessary that an independent retaining substrate is provided and therefore, there is an advantage in that a reduction in the production cost can be attained. However, it is required to use an adequate joining material in the joining of the retaining substrate comprising aforesaid part and the lead frame. As such joining material, it is possible to use a silicone sealant SE4450 (produced by Toray Dow Corning Silicone Kabushiki Kaisha), an adhesive sheet CHOMERICS T404 (produced by Parker Hannifin Corp.), or an adhesive sheet EN500/50-2 (produced by Furukawa Denkikogyo Kabushiki Kaisha).

Semiconductor Element:

As a typical example of the semiconductor element, there can be mentioned a thin type photovoltaic element whose electrode is provided on the non-light receiving face, which is used in the optical-concentration type solar cell module. This is not limitative. The semiconductor element can include hybrit IC, SSR, SCR, and power transistors such as IGBT, which are required to perform heat radiation upon use. These semiconductor elements may be those comprising a single crystal silicon material, a polycrystalline silicon material, an amorphous silicon material, or a compound semiconductor material comprising atoms belonging to groups 111 and V of the periodic table. In the case where the semiconductor element is a photovoltaic element whose electrode is provided on the non-light receiving face, the thickness of the photovoltaic element is preferred to be thin, specifically, for instance, 200 μm or less. Such thin film semiconductor element (photovoltaic element) may be formed, for example, by a method of cutting a silicon ingot by means of wire-saw to obtain a silicon wafer and subjecting said silicon wafer to a semiconductor-forming treatment or a SOI (silicon-on-insulator) method.

Circuit Pattern:

The circuit pattern in the present invention functions to output an electric current rectified or generated in the semiconductor element to the outside of the semiconductor element. The circuit pattern can include those used in IC substrates or printed circuit base boards. The circuit pattern in the present invention has an island-like portion having an electrode-joining portion to be joined with an electrode of the semiconductor element and an external terminal-fixing portion to which an external terminal, for instance, a wire output electrode, is joined, wherein said external terminal-fixing portion is integrated with said electrode-joining portion.

In the case where the semiconductor element comprises a photovoltaic element used in the optical-concentration type solar cell module which has a pair of electrode on the non-light receiving face or an IGBT or the like used in the power transistor which has a pair of electrodes on the back face (the substrate side), the foregoing island-like portion of the circuit pattern is provided in an area where the semiconductor element is mounted so as to be across the circumference of said area.

The present invention is featured in that the groove is provided in the island-like portion of the circuit pattern in order to control the direction of the fused solder material and the flux contained therein to be flown. Specifically, the groove is provided for performing the positioning of the semiconductor element and for preventing the solder material and the flux contained therein from depositing on the light receiving face of the semiconductor element. It is necessary that the groove is provided to entail no electric resistance loss at the electrode joining portion and the external terminal-fixing portion.

Because the groove functions to control the issue of the solder material and the flux contained therein. Therefore, it is necessary for the groove to be provided in the vicinity of the soldering boundary at the time of joining the electrode of the semiconductor element and the electrode-joining portion of the circuit pattern. Particularly, the groove is provided along the island-like portion of the circuit pattern where the semiconductor element is mounted and along the electrode-joining portion where the electrodes of the semiconductor element are joined. And the groove is provided at least at end portions of the island-like portion of the circuit pattern in order to guide the residual of the flux of the solder material, which will be deposited on the light receiving face of the semiconductor element, into the clearances of the island-like portion of the circuit pattern. The groove may be formed by a conventional circuit-forming method by way of press, etching, or half-etching.

The circuit pattern is required that it is constituted by a material which excels in soldering property and bonding property and has high adhesion property with the retaining substrate and high electrical conductivity.

Such material constituting the circuit pattern can include, for example, metals such Cu. Ni, Mg, Mn. Al, Ag, Au, Pt, Ti, Mo and W; electrically conductive materials comprising alloys containing these metals; and electrically conductive pastes containing these metals.

The circuit pattern may be formed, for instance, by a method wherein a given electrically conductive paste is applied on an appropriate substrate such as a metallized substrate by means of printing technique, the resultant is dried, followed by subjecting to a sintering treatment to form a desired circuit pattern, or a method wherein a given conductor is affixed on an appropriate substrate such as a laminated plate comprising a glass fiber cloth impregnated with epoxy resin and which is coppered or a DBC ceramics substrate, and the conductor layer on the substrate is treated by means of resist patterning, etching, and copper foil-surface treatment to form a desired circuit pattern. In the case where the circuit pattern is provided at the lead frame, it is possible to be performed by a conventional method adopted in the case of forming a prescribed circuit pattern at a given lead frame.

In the present invention, if necessary, after the lead frame is joined to the retaining substrate, it is possible that an unnecessary portion of the circuit pattern is removed.

The present invention will be described in more detail with reference to examples. It should be understood that these examples are only for illustrative purposes and are not intended to restrict the scope of the present invention.

In the following, Examples 1 to 5 are of the first aspect of the present invention, and Examples 6 to 8 are of the second aspect of the present invention.

EXAMPLES 1 to 5 OF THE FIRST ASPECT OF THE PRESENT INVENTION

Example 1

FIGS. 1(A) to 1(D) and FIGS. 2(A) and 2(B) are schematic views for explaining an example of a mounting structure and a mounting method of a photovoltaic element.

In FIGS. 1(A) to 1(D) and FIGS. 2(A) and 2(B), reference numeral 1 indicates a square-shaped photovoltaic element comprising a single crystal silicon material and which has a size of 2 mm×12 mm and a thickness of 125 µm. The photovoltaic element 1 has a reflection preventive film (not shown in the figure) having a textured surface structure formed on the light receiving face thereof. In addition, the photovoltaic element 1 has a pair of power output electrodes (not shown in the figure) provided on the non-light receiving face thereof such a state as shown in FIGS. 15(A) to 15(D). Each of the two power output electrodes comprises a 10 µm thick Al electrode deposited with an Au film having a thickness of about 0.01 µm. And the two power output electrodes are electrically connected respectively to the p-type semiconductor layer and the n-type semiconductor of the photovoltaic element.

The embodiment in this example will be detailed with reference to FIGS. 1(A) to 1(D) and FIGS. 2(A) and 2(B).

Step 1 [see, FIG. 1(A)]:

First, using an oxygen-free copper sheet having a thickness of 0.7 mm, there is formed a metal body 2 having a circuit pattern which has an electrode-joining portion for joining electrodes of a photovoltaic element 1 [see, FIGS. 1(C) and 1(D) and FIGS. 2(A) and 2(B)] and an external terminal-fixing portion for fixing an external terminal by means of conventional technique such as press working, wherein said electrode-joining portion and said external terminal-fixing portion are integrated.

Figure 1B:
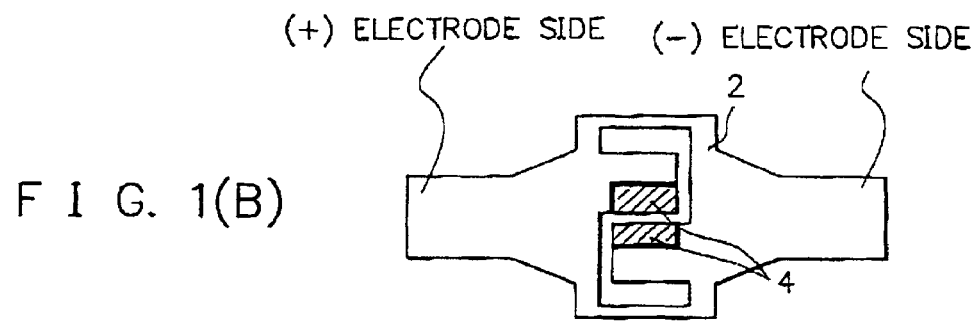

Step 2 [see, FIG. 1(B)]:

Then, at a position of the metal body 2 where the electrodes of the photovoltaic element 1 are to be joined, there is printed a cream solder 4 (comprising a metal solder OZ63-381F4-9.5 having a Sn—Pb eutectic composition, produced by Senju Kinzokukogyo Kabushiki Kaisha) as a joining material to join the metal body 2 and the photovoltaic element 1 at a thickness of 120 m by a conventional screen printing method by means of a metal plate.

Figure 1C:
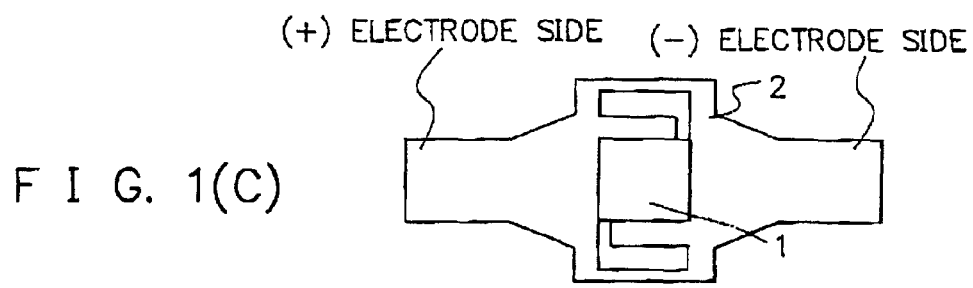

Step 3 [see, FIG. 1(C)]:

At a prescribed position on the metal body 2 where the cream solder 4 is provided, the photovoltaic element 1 is arranged by means of a conventional chip mountor.

Figure 3:
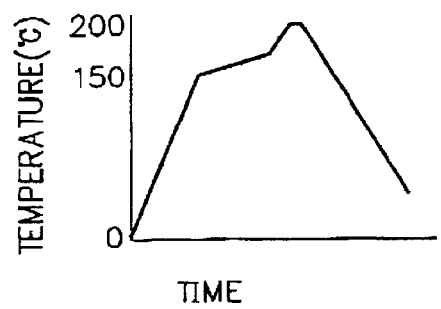
FIG. 3 is a graph showing an example of a temperature change profile with time elapse when a cream solder material is heated in the present invention.

By heating then cooling the metal body 2 under condition of providing such temperature change profile with time elapse as shown in FIG. 3 by means of a conventional reflow apparatus, the cream solder 4 is fused, followed by being solidified, whereby the photovoltaic element 1 is mounted on the metal body 2.

Figure 1D:
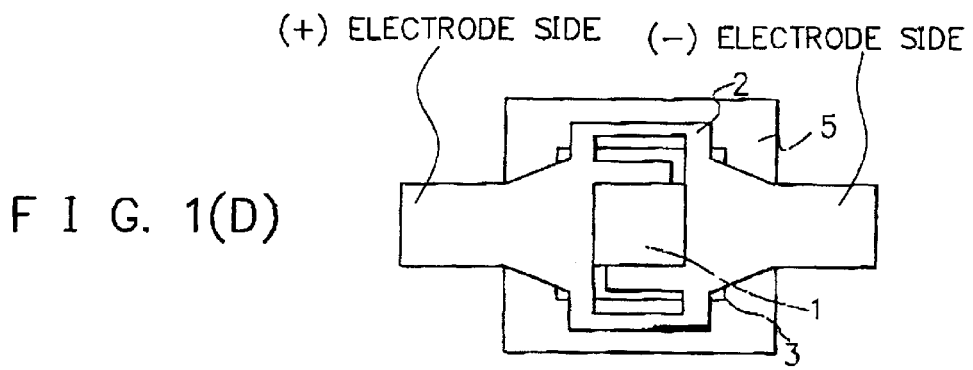

Step 4 [see, FIG. 1(D)]:

At a central portion on a pin type heat sink 5 having a size of 42 mm (width)×42 mm (length)×10 mm (thickness) [comprising a heat sink K4242-10B, produced by Asuka Denshi Service Kabushiki Kaisha] as a heat radiator, a square-shaped insulative double-coated adhesive sheet 3 having a size of 15 mm×15 mm (comprising an insulative double-coated adhesive sheet CHOMERICS T404, produced by Parker Hannifin Corp.) is laminated.

Then, the metal body 2 having the photovoltaic element 1 mounted thereon is arranged on the insulative double-coated adhesive sheet 3 laminated on the heat sink 5, followed by pressing the metal body 2 toward the insulative double-coated adhesive sheet 3 from the photovoltaic element side by introducing air into the air bag press system 116 to expand the air bag thereof as shown in FIG. 4, whereby the metal body is fixed to the heat sink, where the bag expanded by the introduction of the air corresponds the photovoltaic element-mounted structure.

Figure 2A:
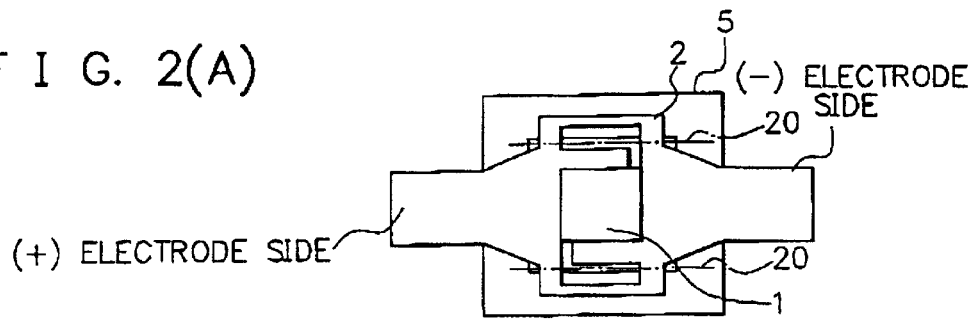
FIGS. 2(A) and 2(B) are schematic views for explaining a mounting structure of a photovoltaic element and a method for mounting said photovoltaic element in Example 1 which will be described later.
Figure 2B:
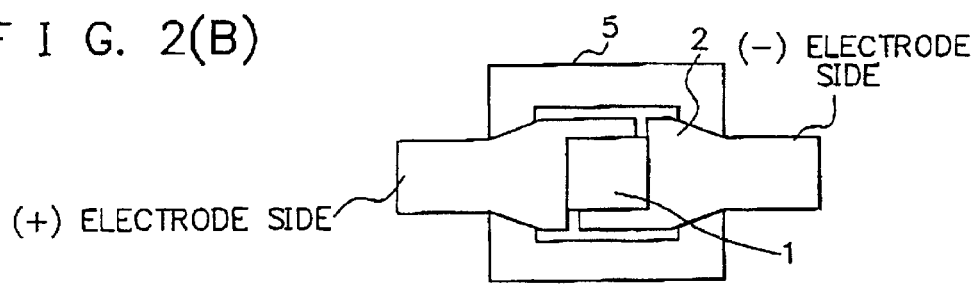

Further, if necessary, part of the metal body 2 indicated by cutting positions 20 as shown in FIG. 2(A) is cut by means of a conventional cutting apparatus such as a diamond cutter. By doing in this way, it is possible to make the metal body to be usable as a pair of power output electrodes [see, FIG. 2(B)].

Example 2

Figure 6A:
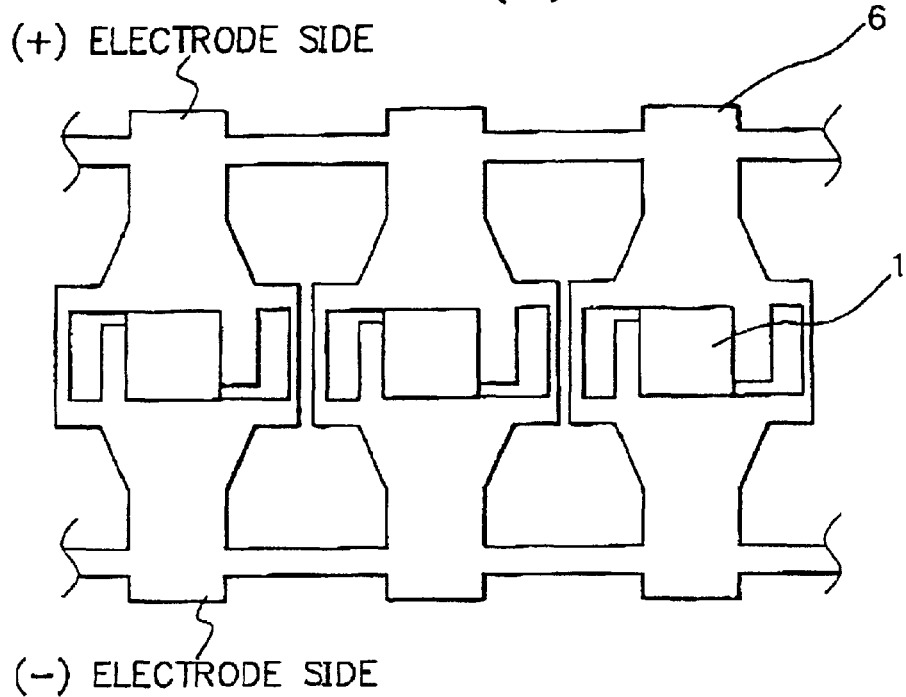
FIGS. 6(A) and 6(B) are schematic views for explaining a metal body and a method for mounting a photovoltaic element on said metal body in Example 2 which will be described later.
Figure 6B:
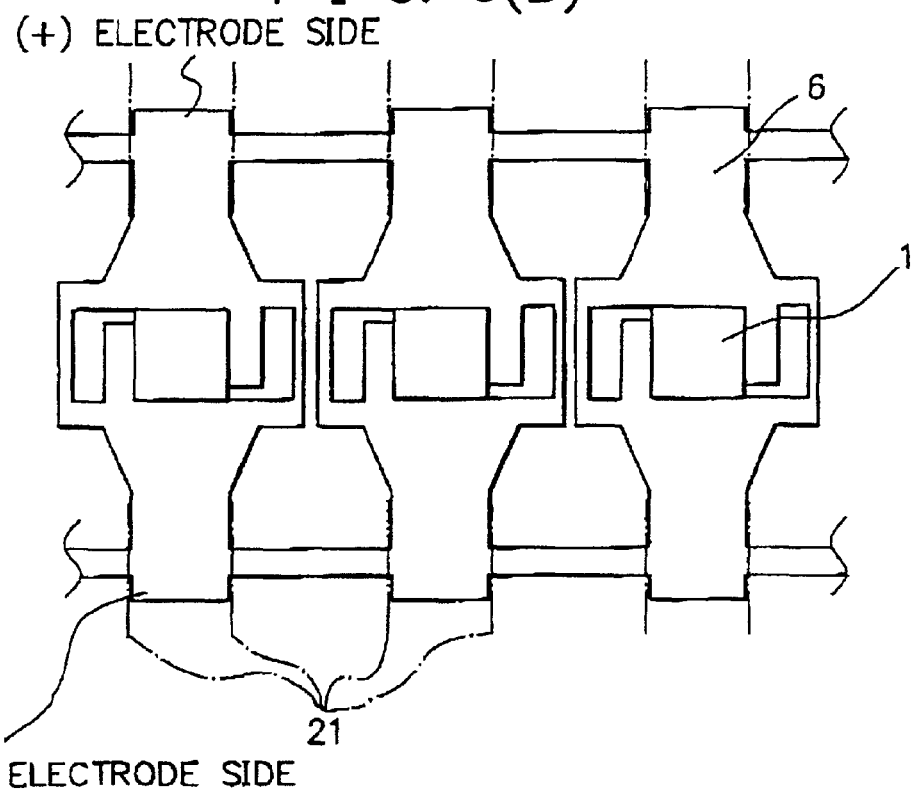

FIGS. 5(A) and 5(B) and FIGS. 6(A) and 6(B) are schematic views for explaining an example of a metal body on which a photovoltaic element is mounted and a mounting method of said photovoltaic element, and which illustrate part of a continuous lead frame 6.

in FIGS. 6(A) and 6(B), reference numeral 1 indicates a square-shaped photovoltaic element comprising a single crystal silicon material and which has a size of 12 mm×12 mm and a thickness of 125 µm.

As well as in the case of Example 1, the photovoltaic element 1 has a reflection preventive film (not shown in the figure) having a textured surface structure formed on the light receiving face thereof and it has a pair of power output electrodes (not shown in the figure) provided on the non-light receiving face thereof, where each of the two power output electrodes comprises a 10 µm thick Al electrode deposited with an Au film having a thickness of about 0.01 µm and the two power output electrodes are electrically connected respectively to the p-type semiconductor layer and the n-type semiconductor layer of the photovoltaic element.

The embodiment in this example will be detailed with reference to FIGS. 5(A) and 5(B) and FIGS. 6(A) and 6(B).

Figure 5A:
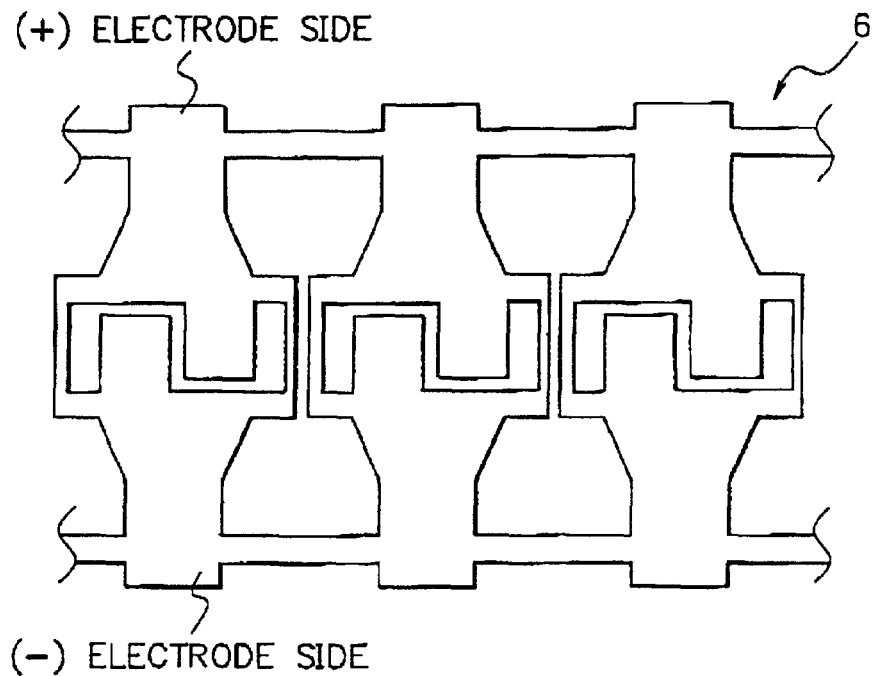
FIGS. 5(A) and 5(B) are schematic views for explaining a metal body and a method for mounting a photovoltaic element on said metal body in Example 2 which will be described later.

Step 1 [see, FIG. 5(A)]:

A metal foil comprising an alloy and having a width of 100 mm, a length of 1000 m and a thickness of 0.3 mm is continuously subjected to press working in a roll-to-roll system to prepare a lead frame 6 having a plurality of frame units each having a circuit pattern formed, said circuit pattern having an electrode-joining portion for joining a photovoltaic element 1 [see, FIG. 6(A)] and an external terminal-fixing portion for fixing an external terminal.

When the photovoltaic element 1 is mounted on each frame unit at later stage, said electrode-joining portion and said external terminal-fixing portion are integrated.

Figure 5B:
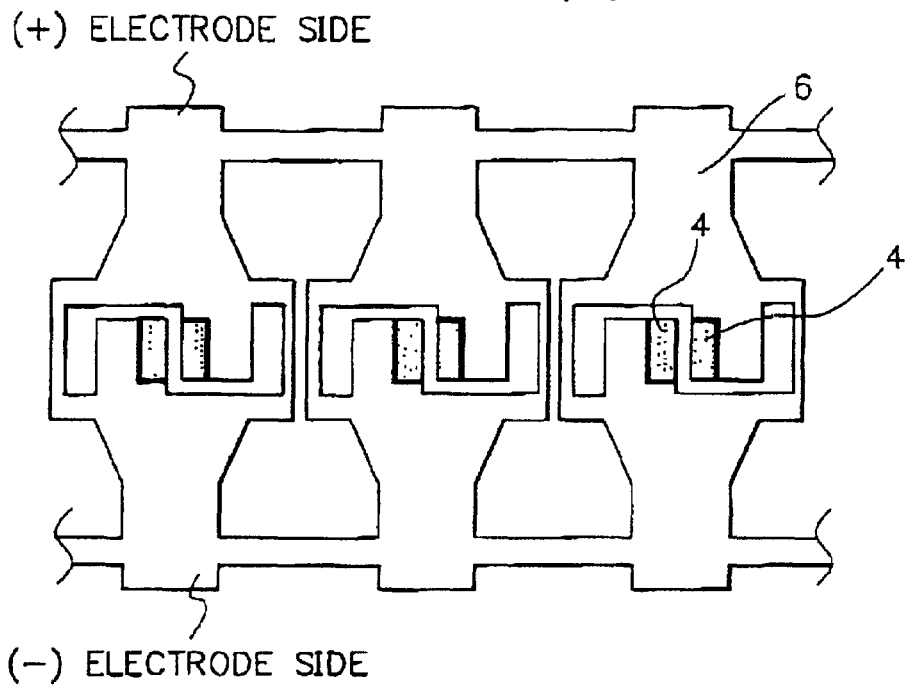

Step 2 [see, FIG. 5(B)]:

At a position on each frame unit of the lead frame 6 where the electrodes of the photovoltaic element 1 are to be joined, there is applied a cream solder 4 (comprising a metal solder OZ63-381F4-9.5 having a Sn—Pb eutectic composition, produced by Senju Kinzokukogyo Kabushiki Kaisha) as a joining material by a conventional dispenser. The cream solder 4 is applied such that a number of dots having a diameter of about 0.6 mm are spacedly arranged at a pitch of 1.5 mm in a rectangular area on an either side as shown in FIG. 5(B).

Step 3 [see, FIG. 6(A)]

At a prescribed position of each frame unit of the lead frame 6 where the cream solder 4 is present, the photovoltaic element is arranged by means of a conventional chip mountor. Then, by heating and cooling the lead frame 6 under condition of providing such temperature change profile with time elapse as shown in FIG. 3 by means of a conventional reflow apparatus, the cream solder 4 on each frame unit is fused, followed by being solidified, whereby the photovoltaic element 1 is mounted on each frame unit of the lead frame 6.

Step 4 [see, FIG. 6(B)]:

FIG. 6(B) is a schematic view showing a state after the photovoltaic has been mounted on each frame unit of the lead frame 6. At cutting positions 21, the lead frame 6 is cut into a plurality of frame units having the photovoltaic element mounted thereon by means of a conventional cutting apparatus such as a diamond cutter.

Although this is not shown in FIGS. 5(A) and 5(B) and FIGS. 6(A) and 6(B), as well as in the case of Example 1, for each frame unit (corresponding to the metal body) having the photovoltaic element 1 mounted thereon obtained in the above, there is provided a pin type heat sink having a size of 42 mm (width)×42 mm (length)×10 mm (thickness) [comprising a heat sink Kaisha] as a heat radiator. Then, at a central portion on the pin type heat sink, a square-shaped insulative double-coated adhesive sheet having a size of 15 mm×15 mm (comprising an insulative double-coated adhesive sheet CHOMERICS T404, produced by Parker Hannifin Corp.) is laminated. Thereafter, each frame unit (the metal body) having the photovoltaic element 1 mounted thereon is arranged on the insulative double-coated adhesive sheet laminated on the heat sink, followed by pressing the metal body toward the insulative double-coated adhesive sheet from the photovoltaic element side by introducing air into the air bag press system 116 to expand the air bag thereof as shown in FIG. 4, whereby the metal body is fixed to the heat sink.

Further, if necessary, part [as indicated by cutting positions 20 in FIG. 2(A)] of the metal body (the frame unit) is cut by means of a conventional cutting apparatus such as a diamond cutter. By doing in this way, it is possible to make the metal body to be usable as a pair of power output electrodes [see, FIG. 2(B)].

In the above-described method of this example, when the photovoltaic element is mounted on the metal body, an elongated lead frame having a plurality of frame units having a circuit pattern is used as the metal body, and the lead frame is continuously supplied, where the photovoltaic element is mounted on each of the frame units using a conventional amounting apparatus. Thus, the method makes it possible to mass-produce a photovoltaic element-mounted structure at a reasonable production cost.

Example 3

FIGS. 7(A) to 7(D) and FIGS. 8(A) and 8(B) are schematic views for explaining an example of a mounting structure and a mounting method of a photovoltaic element.

In FIGS. 7(A) to 7(D) and FIGS. 8(A) and 8(B), reference numeral 1 indicates a square-shaped photovoltaic element comprising a GaAs compound semiconductor material and which has a size of 12 mm×12 mm and a thickness of 125 $\mu$m.

As well as in the case of Example 1, the photovoltaic element 1 has a reflection preventive film (not shown in the figure) having a textured surface structure formed on the light receiving face thereof, and it has a pair of power output electrodes (not shown in the figure) provided on the non-light receiving face thereof. Each of the two power output electrodes comprises a 10 $\mu$m thick Al electrode deposited with an Au film having a thickness of about 0.01 $\mu$m. And the two power output electrodes are electrically connected respectively to the p-type semiconductor layer and the n-type semiconductor layer of the photovoltaic element.

The embodiment in this example will be detailed with reference to FIGS. 7(A) to 7(D) and FIGS. 8(A) and 8(B).

Figure 7A:
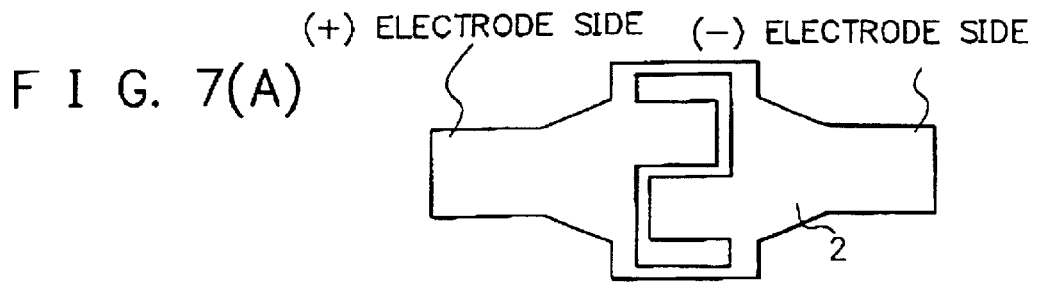
FIGS. 7(A) to 7(D) are schematic views for explaining a mounting structure of a photovoltaic element and a method for mounting said photovoltaic element in Example 3 which will be described later.
Figure 7B:
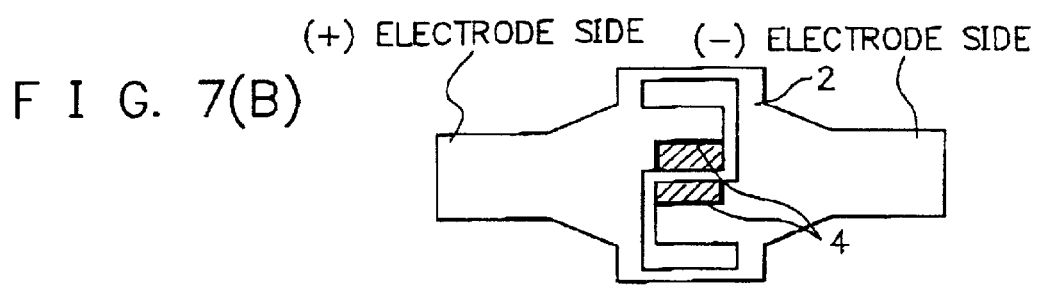
Figure 7C:
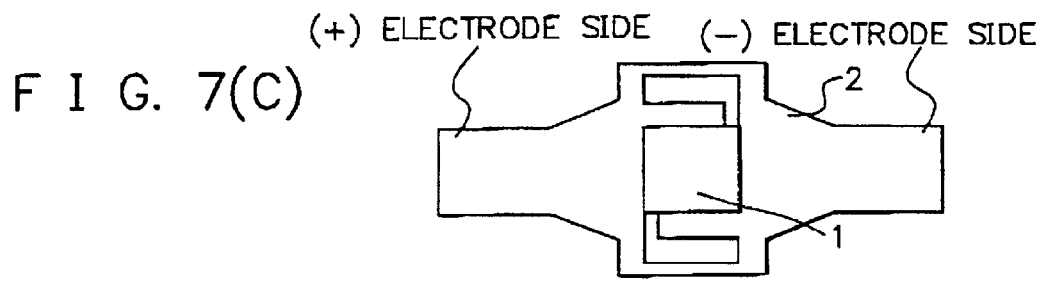
Figure 7D:
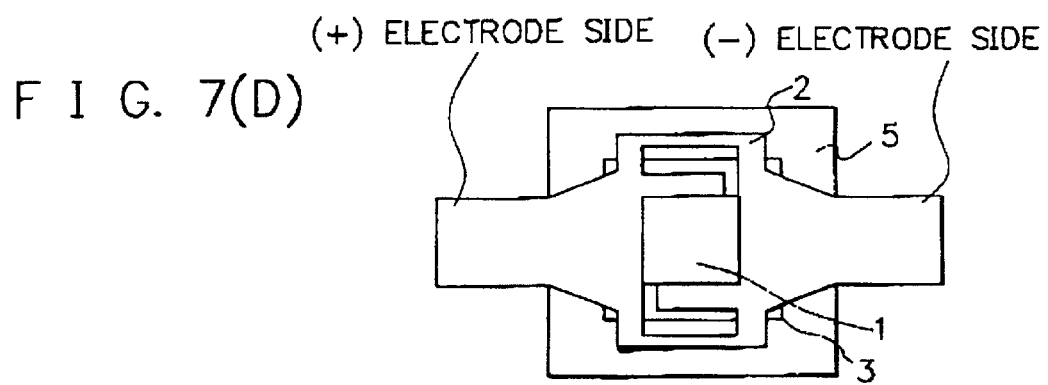
Figure 8A:
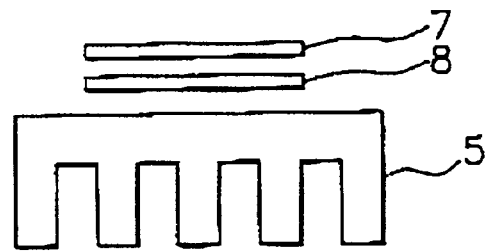
FIGS. 8(A) and 8(B) are schematic views for explaining a mounting structure of a photovoltaic element and a method for mounting said photovoltaic element in Example 3 which will be described later.
Figure 8B:
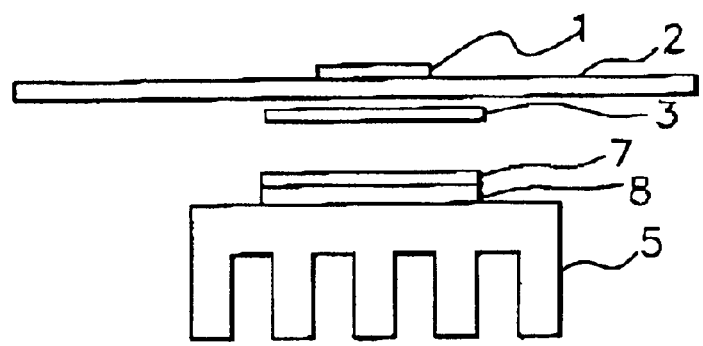

Step 1 [see, FIG. 7(A)]:

First, using an oxygen-free copper sheet having a thickness of 0.7 mm, there is formed a metal body 2 having a circuit pattern which has an electrode-joining portion for joining electrodes of a photovoltaic element 1 [see, FIGS. 7(C), 7(D) and 8(B)] and an external terminal-fixing portion for fixing an external terminal by means of conventional technique such as press working, wherein said electrode-joining portion and said external terminal-fixing portion are integrated.

Step 2 [see, FIG. 7(B)]:

Then, at a position of the metal body 2 where the electrodes of the photovoltaic element 1 are to be joined, there is printed a cream solder 4 (comprising a metal solder OZ63-381F4-9.5 having a Sn—Pb eutectic composition, produced by Senju Kinzokukogyo Kabushiki Kaisha) as a joining material to join the metal body 2 and the photovoltaic element 1 at a thickness of 120 m by a conventional screen printing method by means of a metal plate.

Step 3 [see, FIG. 7(C)]:

At a prescribed position on the metal body 2 where the cream solder 4 is provided, the photovoltaic element 1 is arranged by means of a conventional chip mountor.

By heating then cooling the metal body 2 under condition of providing such temperature change profile with time elapse as shown in FIG. 3 by means of a conventional reflow apparatus, the cream solder 4 is fused, followed by being solidified, whereby the photovoltaic element 1 is mounted on the metal body 2.

Step 4 [see, FIG. 7(D) and FIGS. 8(A) and 8(B)]:

In this example, a ceramic plate is used as a base member 7 [see, FIGS. 8(A) and 8(B)] for joining the metal body having the photovoltaic element mounted thereon and a heat radiator, a silver paste is used as a base member-joining material 8 [see, FIGS. 8(A) and 8(B)] for joining said base member and said heat radiator, and an electrically insulative joining material [see, FIG. 8(B)] having heat conductivity is used for joining said base member and the metal body having the photovoltaic element mounted thereon.

Particularly, as the base member 7, there is provided a 0.32 mm thick square-shaped ceramic plate comprising an alumina ($Al_2O_3$) and having a size of 15 mm×15 mm. A square-shaped insulative double-coated adhesive sheet EN500/50-2 (produced by Furukawa Denkikogyo Kabushiki Kaisha) as the electrically insulative joining material 3 is laminated on a first surface of the ceramic plate 7, and on a second surface of the ceramic plate 7, a silver paste ABLEBOND 84-1LKI-TI (produced by Ablestik Japan Co., Ltd.) as the base member-joining material 8 is uniformly coated at a thickness of 0.2 mm to obtain a composite member.

The composite member comprising the base member 7 S sandwiched between the electrically insulative joining material 3 and the base member-joining material 8 is arranged at a central portion on a pin type heat sink 5 having a size of 42 mm (width)×42 mm (length)×10 mm (thickness) [comprising a heat sink K4242-10B, followed by subjecting to a heat treatment in an oven whose inside is maintained at 125° C. for 2 hours, whereby the composite member is fixed onto the heat sink 5.

Thereafter, the metal body 2 having the photovoltaic element 1 mounted thereon is arranged on the electrically insulative joining material 3 (comprising the insulative double-coated sheet) of the composite member fixed on the heat sink 5, followed by pressing the metal body 2 toward the insulative double-coated adhesive sheet from the photovoltaic element side by introducing air into the air bag press system 116 to expand the air bag thereof as shown in FIG. 4, whereby the metal body is fixed to the heat sink.

Further, if necessary, part [as indicated by cutting positions 20 in FIG. 2(A)] of the metal body 2 is cut by means of a conventional cutting apparatus such as a diamond cutter. By doing in this way, it is possible to make the metal body to be usable as a pair of power output electrodes [see, FIG. 2(B)].

In the above-described method, after the insulative double-coated adhesive sheet and the silver paste are provided respectively on the first surface and the second surface of the ceramic base member, the second surface of the ceramic base member is joined to the heat sink by the heat treatment. This is not limitative. It is possible that after the second surface of the ceramic base member which is provided with the silver paste is joined to the heat sink, the insulative double-coated adhesive sheet is provided on the first surface of the ceramic base member. It is also possible that the ceramic base member whose second surface is provided with the silver paste is arranged at the central position of the heat sink, their fixing is performed by the heat treatment, then the insulative double-coated adhesive sheet is provided on the first surface of the ceramic base member.

Example 4

FIGS. 9(A) to 9(C) and FIGS. 10(A) to 10(C) are schematic views for explaining an example of a metal body on which a photovoltaic element is mounted and a mounting method of said photovoltaic element. Particularly, in this example, description will be made of an example of an optical-concentration type solar cell receiver structure and an optical-concentration type solar cell module in which said receiver structure is used.

In FIGS. 9(A) to 9(C) and FIGS. 10(A) to 10(C), reference numeral 1 indicates a square-shaped photovoltaic element comprising a single crystal silicon material and which has a size of 12 mm×12 mm and a thickness of 125 $\mu$m. As well as in the case of Example 1, the photovoltaic element 1 has a reflection preventive film (not shown in the figure) having a textured surface structure formed on the light receiving face thereof and it has a pair of power output electrodes (not shown in the figure) provided on the non-light receiving face thereof, where each of the two power output electrodes comprises a 10 $\mu$m thick Al electrode deposited with an Au film having a thickness of about 0.01 $\mu$m and the two power output electrodes are electrically connected respectively to the p-type semiconductor layer and the n-type semiconductor layer of the photovoltaic element.

The embodiment in this example will be detailed with reference to FIGS. 9(A) to 9(C) and FIGS. 10(A) to 10(C).
Step 1 [see, FIG. 9(A)]:

A metal foil comprising a Cu—W alloy and having a width of 50 mm, a length of 1000 m and a thickness of 0.3 mm is continuously subjected to press working in a roll-to-roll system to prepare a lead frame 6 having a plurality of circuit patterns at a pitch of 200 mm and having opposite side end portions in the longitudinal direction which are provided with a plurality of small holes 9 corresponding to a delivery structure of a mounting apparatus. Each of the circuit patterns has an electrode-joining portion for joining a photovoltaic element 1.

Each zone of the lead frame 6 where one of the circuit patterns is provided will be hereinafter referred to as circuit pattern-bearing zone.

At a position on each circuit pattern-bearing zone of the lead frame 6 where the electrodes of the photovoltaic element 1 are to be joined, there is applied a cream solder 4 (comprising a metal solder OZ63-381F4-9.5 having a Sn—Pb eutectic composition, produced by Senju Kinzokukogyo Kabushiki Kaisha) as a joining material by a conventional dispenser. The cream solder 4 is applied such that a number of dots having a diameter of about 0.6 mm are spacedly arranged at a pitch of 1.5 mm in a rectangular area on an either side as shown in 9(A).
Step 2 [see, FIG. 9(B)]:

At a prescribed position of each circuit pattern-bearing zone of the lead frame 6 there the cream solder 4 is present, the photovoltaic element 1 is arranged by means of a conventional chip mountor. Then, by heating and cooling the lead frame 6 under condition of providing such temperature change profile with time elapse as shown in FIG. 3 by means of a conventional reflow apparatus, the cream solder 4 on each circuit pattern-bearing zone is fused, followed by being solidified, whereby the photovoltaic element 1 is mounted on each circuit pattern-bearing zone of the lead frame 6. In this way, a plurality of photovoltaic elements 1 can be mounted on the lead frame 6.
Step 3 [see, FIG. 9(C)]:

There are provided a plurality of pin type heat sinks having a size of 42 mm (width)×42 mm (length)×10 mm (thickness)[each heat sink comprising a heat sink K4242-10B, produced by Asuka Denshi Service Kabushiki Kaisha] respectively as a heat radiator 5. At a central position on each heat sink 5, a square-shaped insulative double-coated adhesive sheet 3 having a size of 15 mm×15 mm (comprising an insulative double-coated adhesive sheet CHOMERICS T404, produced by Parker Hannifin Corp.) is laminated. Then, the heat sinks each having the insulative double-coated adhesive sheet 3 laminated thereon are arranged at a pitch of 200 mm under the lead frame 6 such that each of the heat sinks is in contact with the back face of the lead frame through the insulative double-coated adhesive sheet so that the heat sink is situated to face the photovoltaic element present in each circuit pattern-bearing zone of the lead frame. Then, the lead frame 6 is fixed to the heat sinks 5 by pressing from the lead frame side by means of the air bag press system as shown in FIG. 4.

Figure 9A:
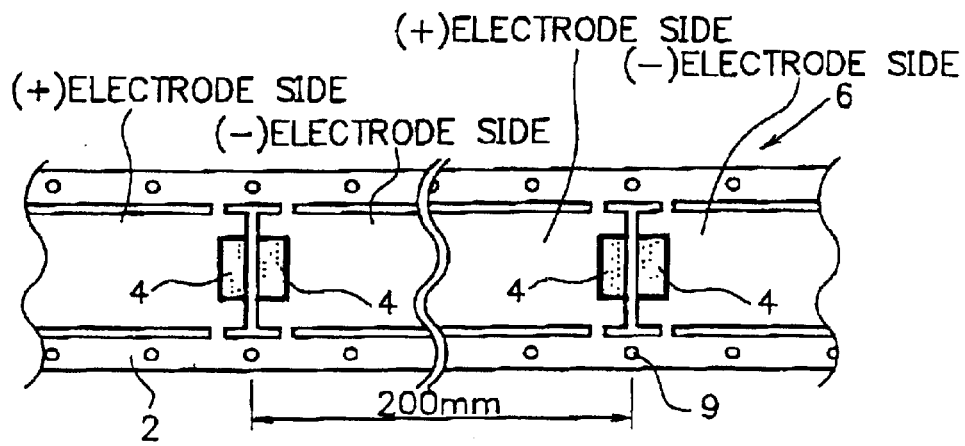
FIGS. 9(A) to 9(C) are schematic views for explaining a mounting structure of a photovoltaic element and a method for mounting said photovoltaic element in Example 4 which will be described later.
Figure 9B:
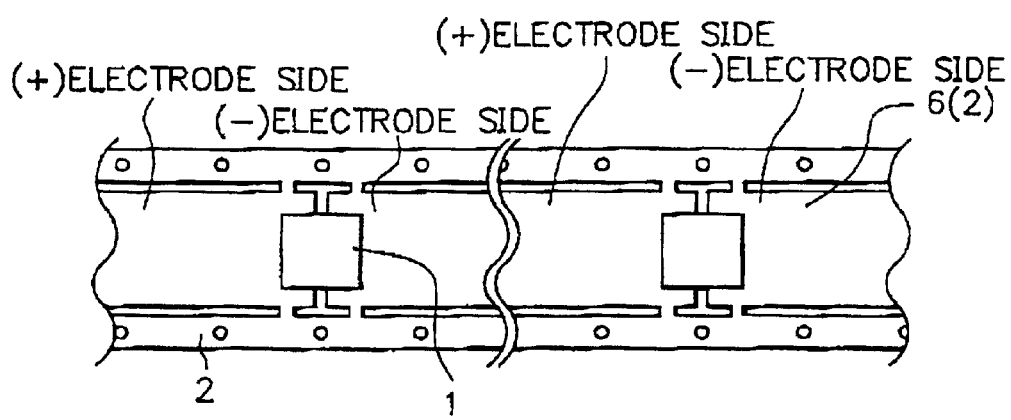
Figure 9C:
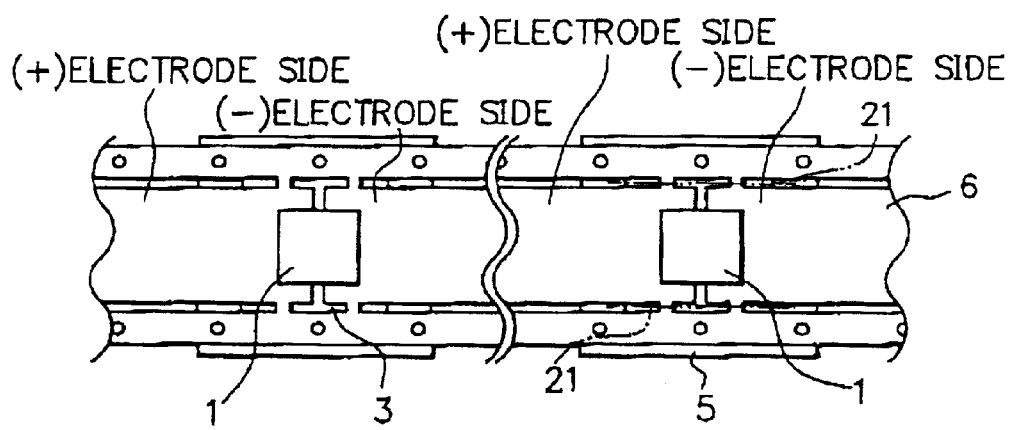
Figure 10A:
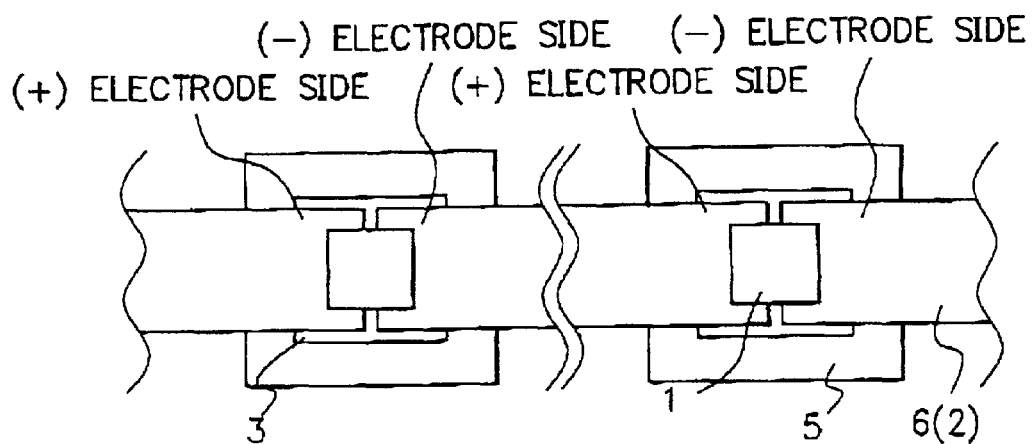
FIGS. 10(A) to 10(C) are schematic views for explaining a mounting structure of a photovoltaic element and a method for mounting said photovoltaic element in Example 4 which will be described later.

Thereafter, by cutting the lead frame 6 at prescribed cutting positions 21 [see, FIG. 9(C)] by means of a conventional cutting apparatus such as a diamond cutter, there is obtained a metal body 6(2) having a plurality of zones at a pitch of 200 mm, each zone is structured such that the metal body is capable of functioning also as a pair of power output terminals of the photovoltaic element and the photovoltaic element is mounted on the metal body in series connection together with the heat sink as shown in FIG. 10(A).

The metal body 6(2) is cut so that 5 of the zones each having the photovoltaic element serialized on the metal body become to be one unit, whereby a plurality of optical-concentration type solar cell receivers are obtained.

Figure 10B:
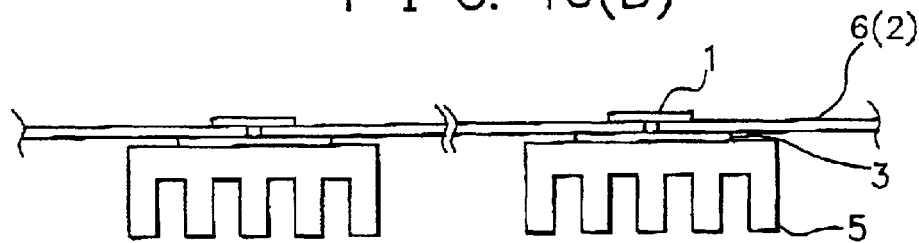

FIG. 10(B) is a schematic view of the structure of the metal body 6(2) when viewed from the side face thereof.

Figure 10C:
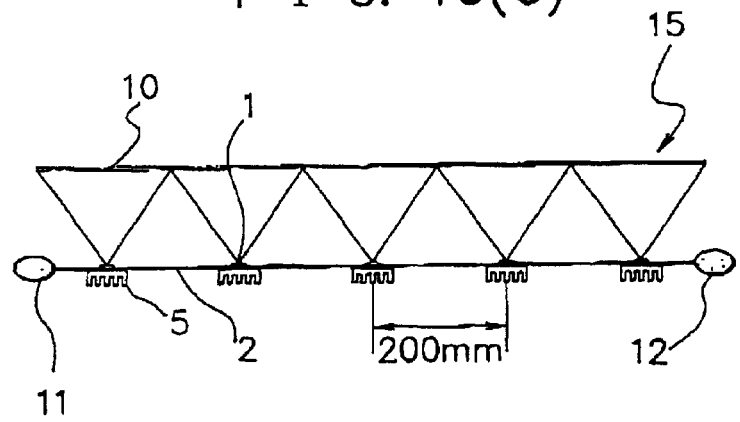

FIG. 10(C) is a schematic view illustrating an optical-concentration type solar module 15 in which one of the above optical-concentration type solar cell receivers is arranged and a condenser lens 10 comprising a Fresnel lens is provided above the optical-concentration type solar cell receiver. In FIG. 10(C), each of reference numerals indicates an side terminal.

In this example, as above described, a plurality of photovoltaic elements are mounted on the elongated metal body in accordance with the roll-to-roll method and a plurality of heat sinks are fixed to the metal body, and thereafter, the metal body is cut so that 5 of the photovoltaic elements become to be one unit.

In this example, it is possible to adopt a method wherein a metal body having a length of, for instance, 1500 mm capable of arranging 5 photovoltaic elements thereon is transported in a batch system where 5 photovoltaic elements are mounted on the metal body, and 5 heat sinks are fixed to the metal body to obtain an optical-concentration type solar cell receiver.

Example 5

Figure 11A:
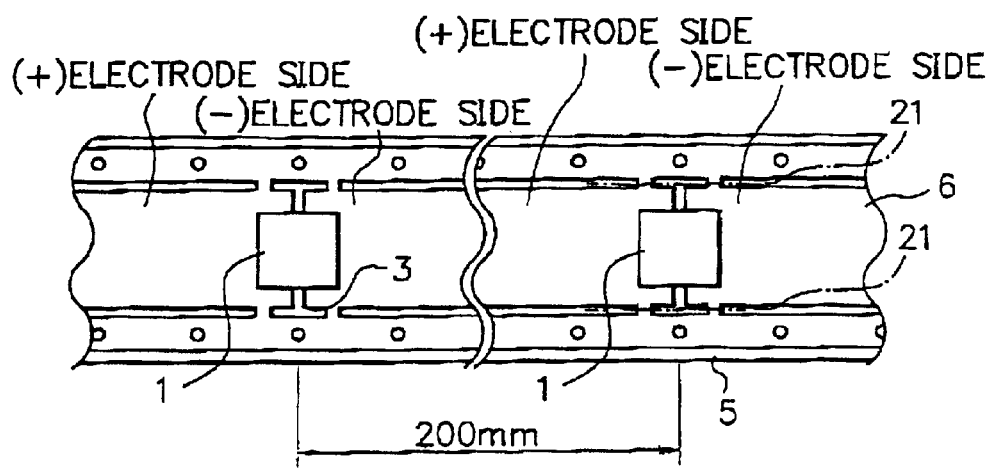
FIGS. 11(A) to 11(C) are schematic views for explaining a mounting structure of a photovoltaic element and a method for mounting said photovoltaic element in Example 5 which will be described later.
Figure 11B:
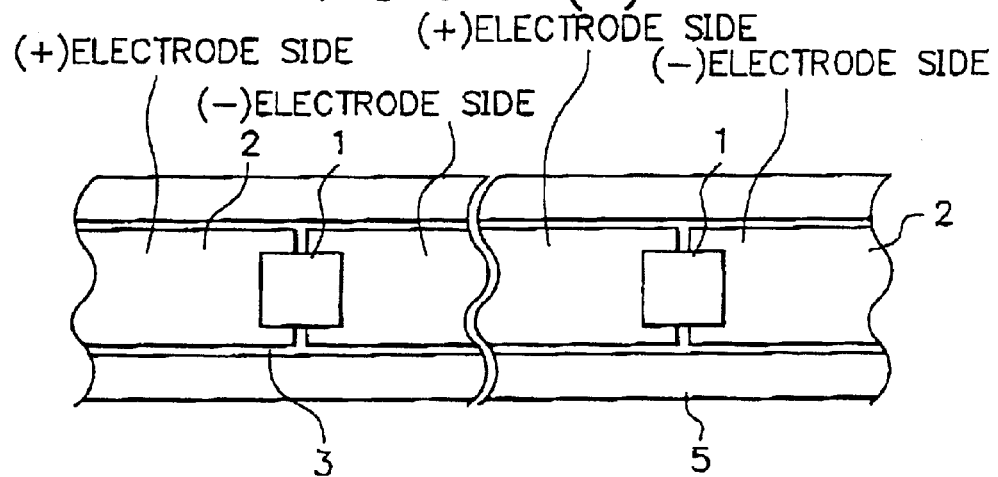
Figure 11C:
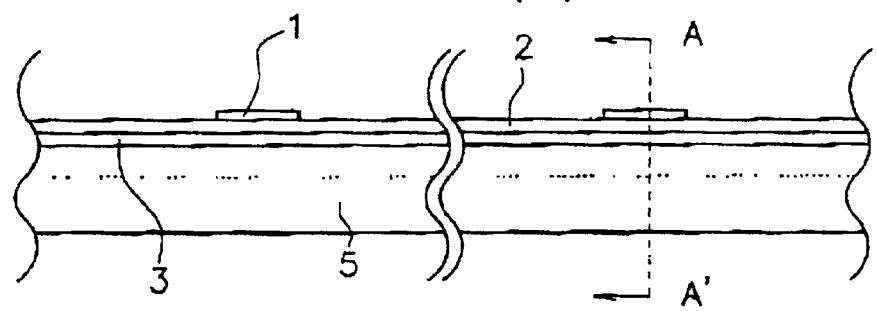

FIGS. 11(A) to 11(C) are schematic views for explaining an example of a photovoltaic element-mounted structure. Particularly, in this example, description will be made of an example of an optical-concentration type solar cell receiver structure and an optical-concentration type solar cell module in which said receiver structure is used.

FIG. 11(A) is a schematic view illustrating the configuration of a front face of a structure in which a plurality of photovoltaic elements 1 are mounted on a lead frame 6 (which serves as a metal body) and a single heat radiator 5 is mounted to the metal body in accordance with the manner described in Example 4. This example is different from Example 4 with a point in that the plurality of head radiators are mounted to the metal body in Example 4, but in this example, the single heat radiator is mounted to the metal body.

FIG. 11(B) is a schematic view illustrating the configuration of a front face of a structure in which the metal body 2 having the photovoltaic elements 1 mounted thereon shown in FIG. 11(A) is cut at prescribed cutting positions 21 [see, FIG. 11(A)] as in Example 4. The structure shown in FIG. 11(B) is corresponding to an optical-concentration type solar cell receiver.

FIG. 11(C) is a schematic elevation view of the structure shown in FIG. 11(B).

Figure 12A:
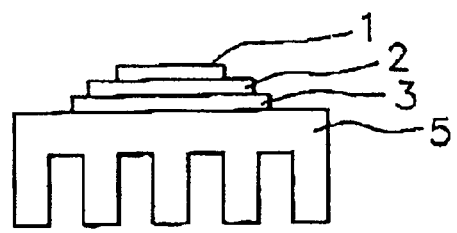
FIGS. 12(A) and 12(B) are schematic views for explaining a mounting structure of a photovoltaic element and a method for mounting said photovoltaic element in Example 5 which will be described later.

FIG. 12(A) is a schematic cross-sectional view, taken along the line A–A' in FIG. 11(C).

Figure 12B:
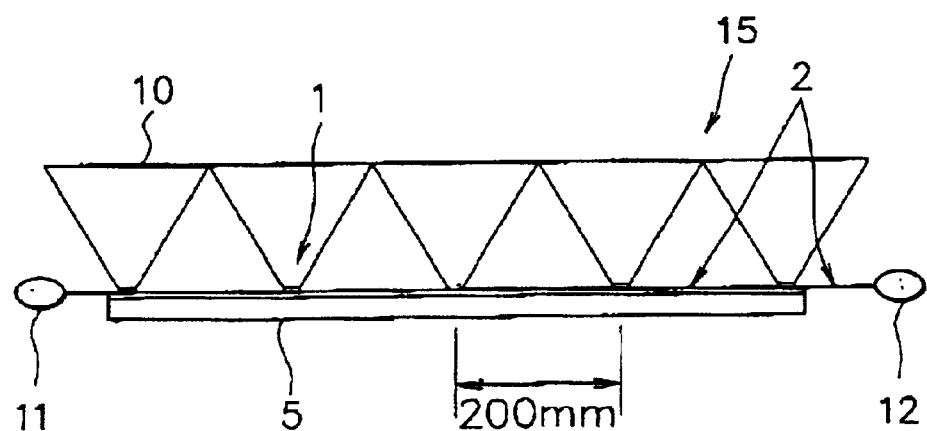
Figure 13A:
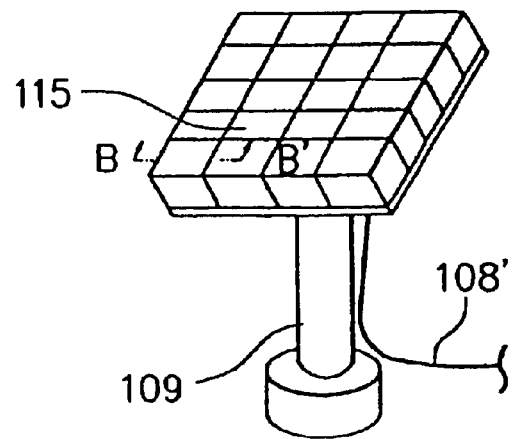
FIG. 13(A) is a schematic view illustrating an example of a conventional optical-concentration type solar power generation system.
Figure 13B:
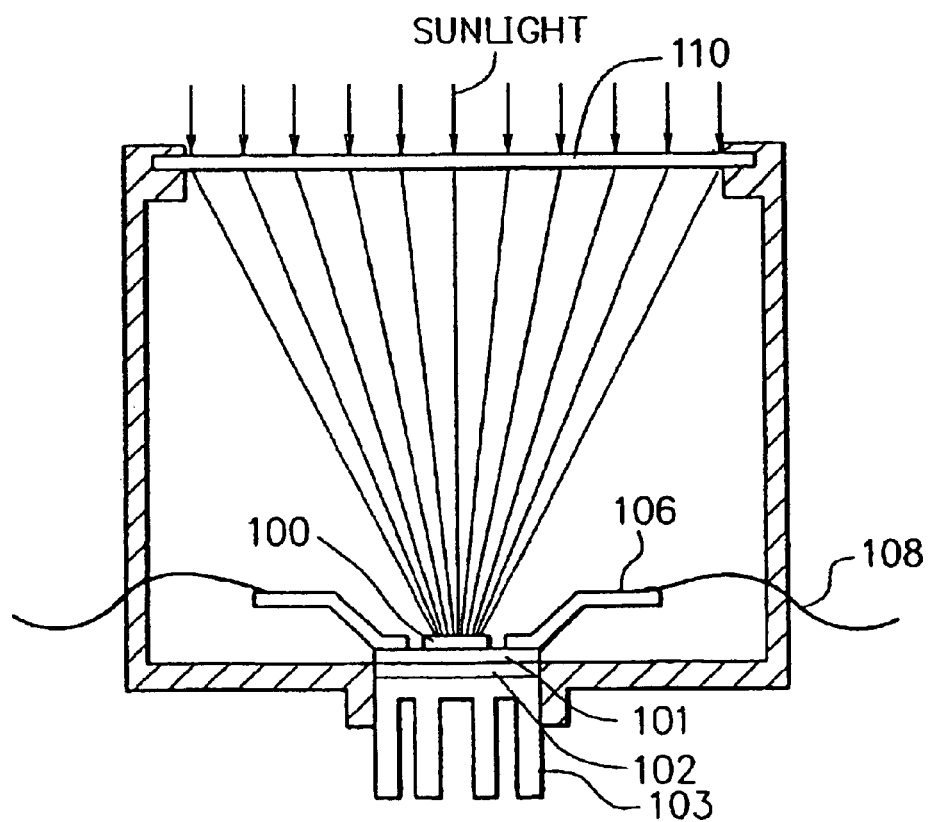
FIG. 13(B) is a tic view illustrating an example of a conventional optical-concentration type solar cell module used in the solar power generation system shown in FIG. 13(A).
Figure 14:
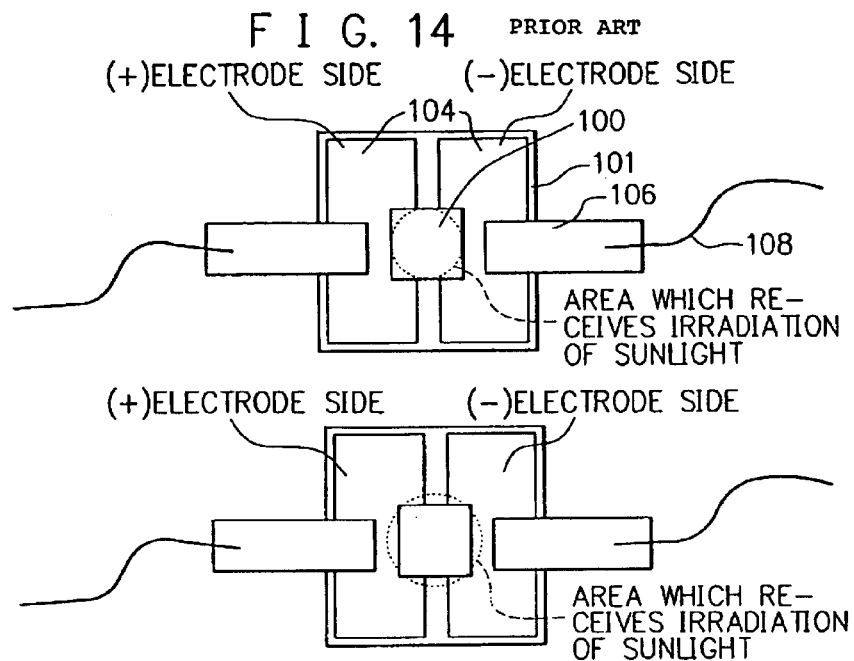
FIG. 14 is a schematic diagram illustrating the configuration of neighborhood of given photovoltaic elements in the light receiving face side of the solar power generation system shown in FIGS. 13(A) and 13(B), when viewed from above.
Figure 15C:
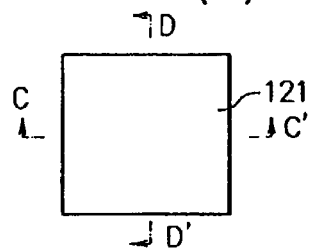
Figure 15C:
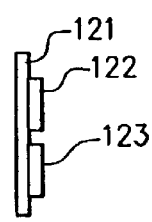
Figure 15D:
Figure 15D:
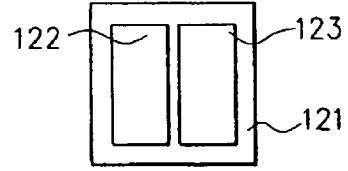
Figure 16A:
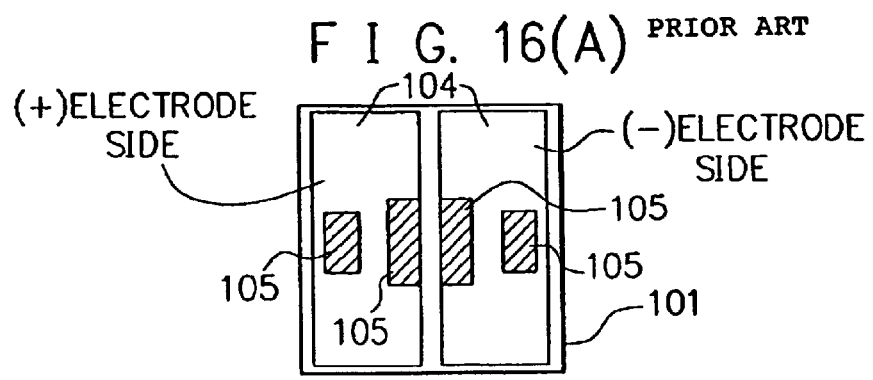
FIGS. 16(A) to 16(D) are schematic views for explaining a photovoltaic element used in the conventional optical-concentration type solar cell module shown in FIG. 13(B).
Figure 16B:
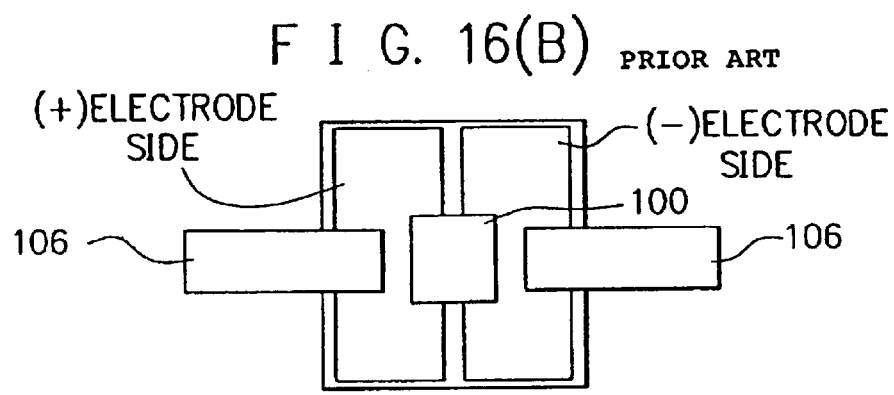
Figure 16C:
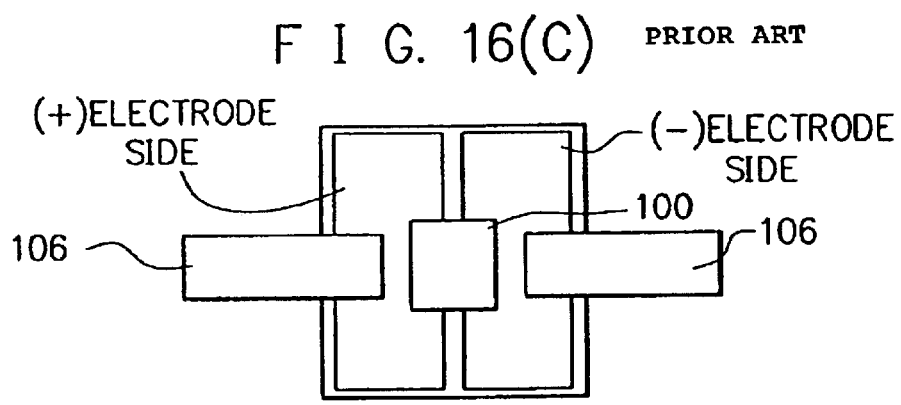
Figure 16D:
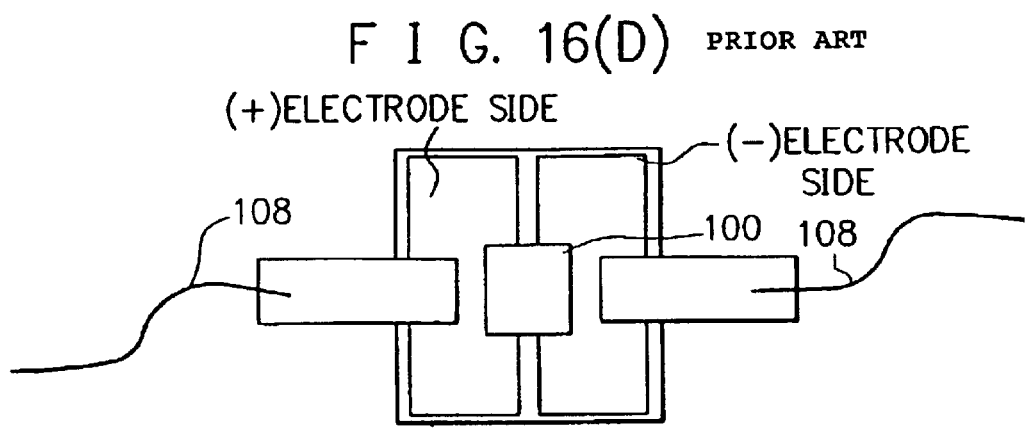
Figure 17A:
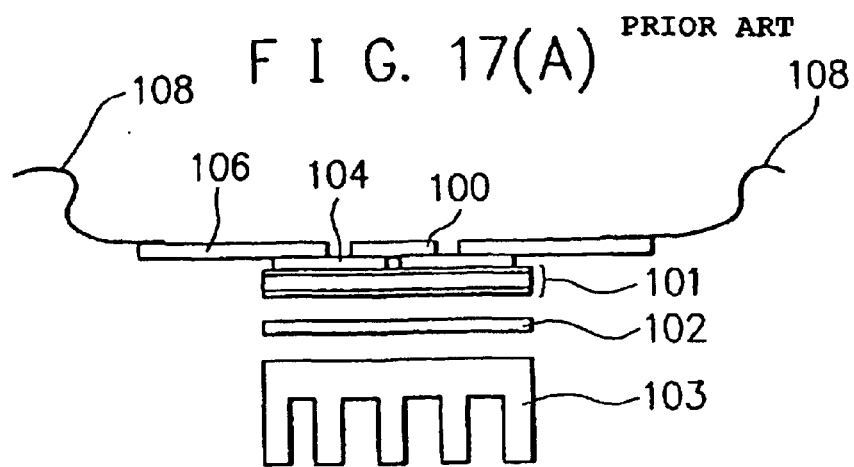
FIGS. 17(A) to 17(C) are schematic views for explaining a photovoltaic element used in the conventional optical-concentration type solar cell module shown in FIG. 13(B).
Figure 17B:
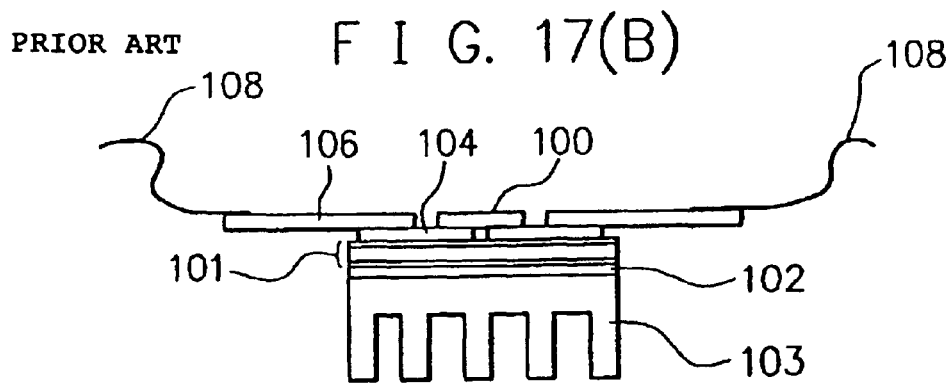
Figure 17C:
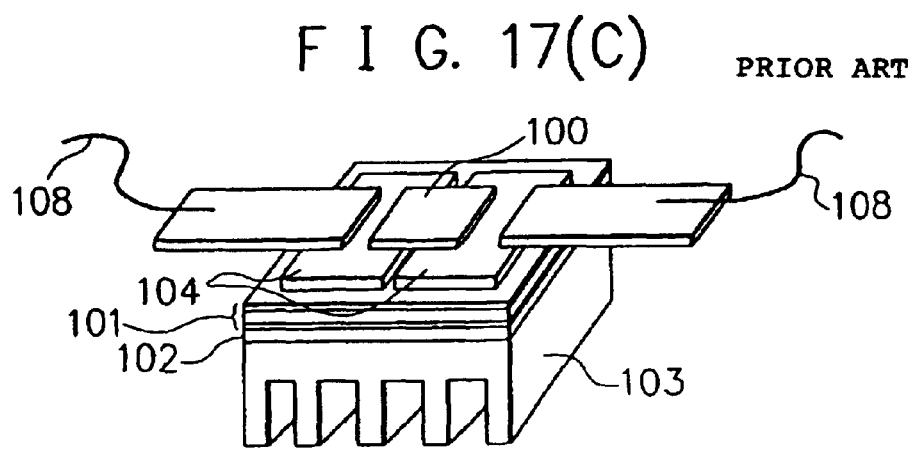

FIG. 12(B) is a schematic view illustrating an optical-concentration type solar cell module 15 in which an optical-concentration type solar cell receiver having such structure as shown in FIGS. 11(B) and 11(C) is arranged and a Fresnel lens is provided above the optical-concentration type solar cell receiver. In FIG. 12(B), each of reference numerals 11 and 12 indicates a side terminal.

Particularly, as above described, this example is different from Example 4 with a point in that the heat radiator structure is changed. That is, in this example, as well as in Example 4, on a metal foil comprising a Cu—W alloy as the lead frame, a plurality of photovoltaic elements are mounted at a pitch of 200 mm in the same manner as in Example 4.

The lead frame is cut at prescribed positions to obtain a metal body 2 on which the photovoltaic elements are intermittently mounted. Then the metal body 2 is cut at a pitch of 1000 mm so that 5 of the photovoltaic elements become to be one unit. At the second surface of the metal body of the unit obtained, a fin-shaped heat sink 5 having a cross section of 42 mm×10 mm and a length of 880 mm formed by way of extrusion of an aluminum member is fixed through an insulative double-coated adhesive sheet CHOMERICS T404 (produced by Parker Hannifin Corp.) as the electrically insulative joining material.

In this way, there are obtained a plurality of optical-concentration type solar cell receivers. One of the optical-concentration type solar cell receivers is used in the optical-concentration type solar cell module shown in FIG. 12(B) as above described.

In the optical-concentration type solar cell receiver of this example, the photovoltaic elements are electrically connected with each other in series connection by the metal body, and the metal body functions as a part of power output electrodes for the photovoltaic elements mounted on the metal body.

Further, the heat sink used in this example can be mass-produced in a simple manner by way of extrusion of an aluminum member as above described, and it functions also as a support to retain not only the optical-concentration type solar cell receiver but also the optical-concentration type solar cell module.

Separately, as well as in Example 4, it is possible to adopt a method wherein a metal body having a length of, for instance, 1500 mm capable of arranging photovoltaic elements thereon is transported in a batch system where 5 photovoltaic elements are mounted on the metal body.

Further, it is possible to adopt a method wherein after the metal body is fixed to the heat radiator, the photovoltaic elements are mounted on the metal body.

In addition, in this example, for the heat radiator, the metal body is arranged in the extruded direction thereof. This is not limitative. It is possible that the metal body is arranged in a direction substantially perpendicular to the extruded direction. Further in addition, in this example, the 5 photovoltaic elements are mounted on the metal body of the foregoing unit. But this is only for illustrative purposes. There is no particular limitation for the number of photovoltaic elements mounted on the metal body.

As will be understood from the above description, in the mounting structure and the mounting method of the present invention, there is adopted a structure in that the photovoltaic elements having a pair of power output electrodes on the non-light receiving face thereof is mounted on the first surface of the metal body and the electrically insulative material is joined on the second surface of the metal body.

Because of this, it is possible that the metal body serves as a heat spreader to have a heat-radiating function and a large electric current is readily outputted by the metal body. And by joining the heat radiator to the metal body through the electrically insulative material, the head radiation efficiency is significantly improved, Further, by making the metal body to be in a form capable of mounting a plurality of photovoltaic elements on the same frame portion thereof, it is possible that an elongated metal body having a prescribed pattern in a roll form is continuously supplied while continuously mounting a plurality of photovoltaic elements and the metal body having the photovoltaic elements mounted thereon is cut into a plurality of units each comprising the metal body unit having a prescribed number of the photovoltaic elements.

Particularly, because such elongated metal body can be used, by providing a plurality of notches or holes at opposite side end portions of the metal body at an equal interval in the longitudinal direction so as to agree with a delivery structure of a mounting apparatus, the continuous production of a structure comprising the metal body unit having a plurality of photovoltaic elements mounted thereon becomes possible, wherein the throughput is improved and a conventional mounting apparatus can be used as the mounting apparatus. This results in a reduction in the production cost.

EXAMPLES 6 TO 8 OF THE SECOND ASPECT OF THE PRESENT INVENTION

Example 6

Figure 18A:
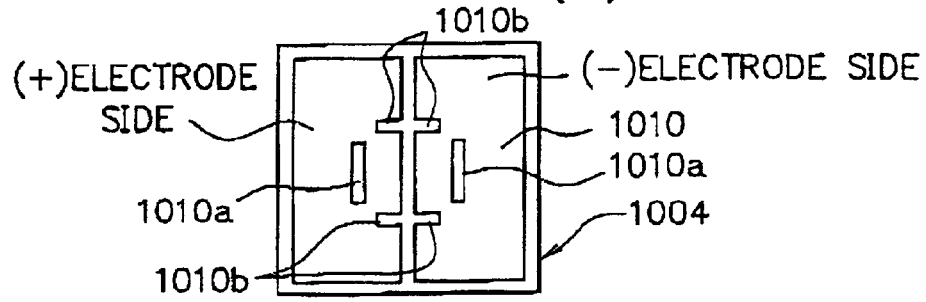
Figure 18B:
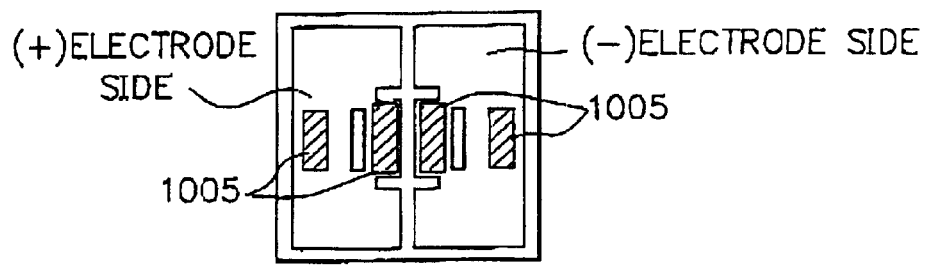
Figure 18C:
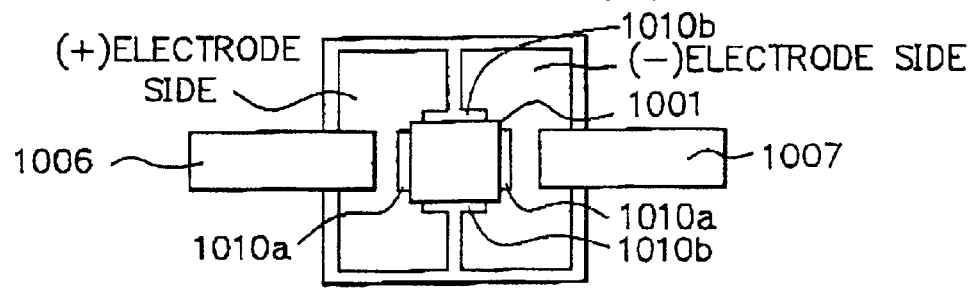

FIGS. 18(A) to 18(C) are schematic views for explaining an example of a retaining substrate for mounting a semiconductor element thereon and a structure after said semiconductor element is mounted on said retaining substrate.

Particularly, FIG. 18(A) is a schematic external view of said retaining substrate when viewed from the front face side. In FIG. 18(A), reference numeral 1004 indicates a retaining substrate on which a semiconductor element is to be mounted. The retaining substrate 1004 comprises a 0.64 mm thick ceramic plate comprising an alumina ($Al_2O_3$) and having a size of 25.4 mm×25.4 mm. On the back face of the retaining substrate 1004, there is provided a 0.25 mm thick copper foil comprising an oxygen-free copper material so as to cover the entire area thereof by means of a DBC (direct bonding copper) method.

On the front face of the retaining substrate 1004 on which a semiconductor element is to be mounted, a pair of circuit patterns 1010 comprising a 0.3 mm thick copper foil formed of an oxygen-free copper material are arranged by means of the DBC method such that they are opposed to each other as shown in FIG. 8(A).

At an area of each of the two circuit patterns 1010 where the semiconductor element is to be situated, there are provided a rectangular-shaped groove 1010a having a depth of 0.1 mm and a size of 0.8 mm (width)×10 mm (length) and two rectangular-shaped nicks 1010b having a depth of 0.3 mm and a size of 0.8 mm (width)×3 mm (length) such that the semiconductor element is surrounded by the groove 1010a and the two nicks 1010b of one circuit pattern 1010 and those of the other circuit pattern 1010 from the upper and lower sides and the left and right sides. Each of the nicks 1010b functions as a groove. The two nicks 1010b of each circuit pattern 1010 are formed upon forming the circuit pattern. The groove 1010a of each circuit pattern is formed by way of half-etching.

FIG. 18(B) is a schematic view illustrating a state in that cream solders 1005 are screen-printed on the front face of the retaining substrate 1004.

Particularly, for each of the two circuit patterns 1010 arranged on the retaining substrate 1004, at an area surrounded by the two grooves 1010b and the groove 1010a where the semiconductor element is to be situated and also at an area outside the groove 1010a where an power output electrode [1006, 1007: see, FIG. 18(C)] is to be provided, a cream solder 1005 (comprising a metal solder OZ63-381F4-9.5 having a Sn—Pb eutectic composition, produced by Senju Kinzokukogyo Kabushiki Kaisha) is provided by means of screen printing.

FIG. 18(C) is a schematic view illustrating a state in that a semiconductor element 1001 and a pair of power output electrodes 1006 and 1007 are mounted on the front face of the retaining substrate 1004 shown in FIG. 18(B).

Particularly, the semiconductor element 1001 is mounted on an area surrounded by the grooves 1010a and 1010b of the two circuit patterns 1010 arranged on the retaining substrate and wherein the cream solders 1005 are present, and the two power output electrodes 1006 and 1007 are mounted respectively on an area where the cream solder 105 is present outside the groove 1010a of one circuit pattern 1010 and on an area where the cream solder 1005 is present outside the groove 1010a of the other circuit pattern 1010.

In this example, the semiconductor element 1001 comprises a square-shaped photovoltaic element comprising a single crystal silicon material and which has a size of 12 mm×12 mm and a thickness of 125 µm. The photovoltaic element has a reflection preventive film (not shown in the figure) having a textured surface structure formed on the light receiving face thereof.

In addition, the photovoltaic element has a pair of power output electrodes (not shown in the figure) provided on the non-light receiving face thereof. Each of the two power output electrodes comprises a 10 µm thick Al electrode deposited with an Au film having a thickness of about 0.01 µm. And the two power output electrodes are electrically connected respectively to the p-type semiconductor layer and the n-type semiconductor layer of the photovoltaic element.

Each of the power output electrodes 1006 and 1007 comprises an oxygen-free copper foil having a thickness of 0.7 mm a width of 15 mm and a length of 75 mm.

Figure 19:
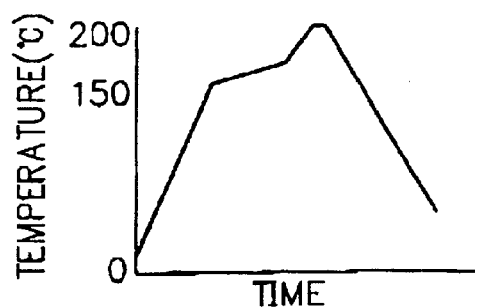
FIG. 19 is a graph showing a temperature change profile with time elapse when a cream solder material is heated in Example 6 which will be described later.

After the photovoltaic element 1001 and the two power output electrodes 1006 and 1007 are mounted on the retaining substrate 1004 as above described, by heating and cooling the retaining substrate under condition of providing such temperature change profile with time elapse as shown in FIG. 19 by means of a conventional reflow apparatus, the cream solders 1005 on the retaining substrate are fused, followed by being solidified, whereby the photovoltaic element 1001 and the two power output electrodes 1006 and 1007 can surely mounted on the retaining substrate 1004.

At this time, because the grooves are provided around the semiconductor element (the photovoltaic element), the fused solder is prevented from issuing and as a result, the originally arranged position of the semiconductor element is maintained without being displaced due to the surface tension of the fused solder.

And because the grooves are provided at side end portions of the circuit patterns, the residual of the flux contained in the fused solder is flown into the grooves, there is not occurred such a problem in the prior art that the flux is flown to deposit on the light receiving face of the semiconductor element.

Example 7

FIGS. 21(A) to 21(C) are schematic views for explaining an example of a retaining substrate for mounting a semiconductor element thereon and a structure after said semiconductor element is mounted on said retaining substrate.

The semiconductor element which is mounted on the retaining substrate in this example comprises A square-shaped power transistor shown in FIGS. 20(A) and 20(B) having a thickness of 180 µm and a size of 12 mm×12 mm and which has an electrode 1011 comprising 4 poles on the back side (the substrate side) thereof. And an Au film having a thickness of about 0.01 µm is vacuum-deposited on the surface of the electrode.

Particularly, FIG. 21(A) is a schematic external view of said retaining substrate when viewed from the front face side. In FIG. 21(A), reference numeral 1004 indicates a retaining substrate on which a semiconductor element is to be mounted. The retaining substrate 1004 comprises a square-shaped epoxy-glass laminate having a thickness of 2 mm and a size of 25.4 mm×25.4 mm.

On the front face of the retaining substrate 1004 on which aforesaid semiconductor element is to be mounted, four circuit patterns A, B. C, and D shaped in a triangle-like form and comprising an oxygen-free copper foil having a thickness of 0.1 mm are provided such that the circuit patterns A and C are opposed to each other and the circuit patterns B and D are opposed to each other as shown in FIG. 21(A).

The four circuit patterns A to D are corresponding to the four poles of the above-described power transistor 1011 as the semiconductor element.

Each circuit pattern has an end portion tapered toward a central position on the retaining substrate 104. Reference numeral 1010 in FIG. 21(A) indicates a square-shaped groove having a depth of 0.1 mm and a size of 0.2 mm×0.2 mm which is provided at a position where said end portion of each of the four circuit patterns A to D is situated.

FIG. 21(B) is a schematic view illustrating a state in that cream solders 1005 are screen-printed on the retaining substrate shown in FIG. 21(A). Particularly, a cream solder 1005 (comprising a metal solder OZ63-381F4-9.5 having a Sn—Pb eutectic composition, produced by Senju Kinzokukogyo Kabushiki Kaisha) is printed on areas where the electrodes of a semiconductor element 1001 [see, FIG. 21(C)] comprising the above-described power transistor loll are joined with the four circuit patterns A to D, by means of screen printing as shown in FIG. 21(B).

FIG 21(C) is a schematic view illustrating a state in that the semiconductor element 1001 is mounted on the front face of the retaining substrate 1004 shown in FIG. 21(B). Particularly, the semiconductor element 1001 (comprising the foregoing power transistor 1011) is mounted on the areas where the cream solders are provided.

After the photovoltaic element 1001 is mounted on the retaining substrate 1004 as above described, by heating and cooling the retaining substrate under condition of providing such temperature change profile with time elapse as shown in FIG. 19 by means of a conventional reflow apparatus, the cream solders 1005 on the retaining substrate are fused, followed by being solidified, whereby the photovoltaic element 1001 can surely mounted on the retaining substrate 1004.

At this time, because the grooves 1010 are provided around the area where the Joining portions of the circuit patterns are Joined with the electrodes of the semiconductor element, the fused solder is prevented from issuing and as a result, the originally arranged position of the semiconductor element is maintained without being displaced due to the surface tension of the fused solder.

Thus, without the necessity to provide a resist or the like on the retaining substrate, the semiconductor element can be mounted at a prescribed position on the retaining substrate.

Example 8

FIGS. 22(A) to 22(E) and FIGS. 23(A) and 23(B) are schematic views for explaining an example of a semiconductor-mounting substrate comprising a retaining substrate for a semiconductor element and a lead frame joined to said retaining substrate and a method of mounting a semiconductor element or the like on said mounting substrate.

In the following, description will be made of part of a lead frame which is continuously formed.

In FIGS. 22(A) to 22(E) and FIGS. 23(A) and 23(B), reference numeral 1001 indicates a semiconductor element. In this example, as the semiconductor element 1001, there is used a square-shaped photovoltaic element comprising a single crystal silicon material and which has a size of 12 mm×12 mm and a thickness of 125 μm. The photovoltaic element 1001 has a reflection preventive film (not shown in the figure) having a textured surface structure formed on the light receiving face thereof and it has a pair of power output electrodes (not shown in the figure) provided on the non-light receiving face thereof.

Each of the two power output electrodes comprises a 10 μm thick Al electrode deposited with an Au film having a thickness of about 0.01 μm, and the two power output electrodes are electrically connected respectively to the p-type semiconductor layer and the n-type semiconductor layer of the photovoltaic element.

The embodiment in this example will be detailed with reference to FIGS. 22(A) to 22(E) and FIGS. 23(A) and 23(B).

Figure 22A:
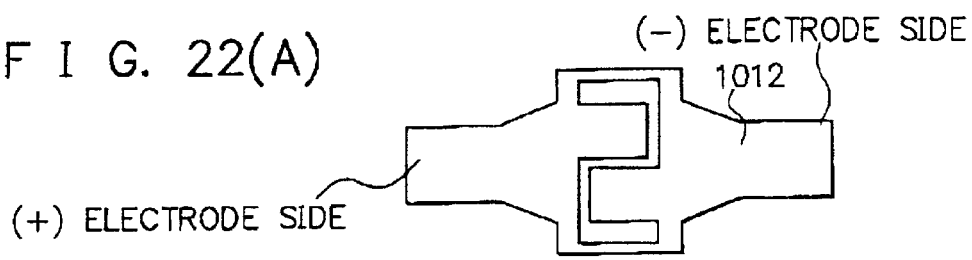
FIGS. 22(A) to 22(E) are schematic views for explaining a retaining substrate for mounting a semiconductor element thereon and a state after said semiconductor element is mounted on said retaining substrate in Example 8 which will be described later.
Figure 22B:
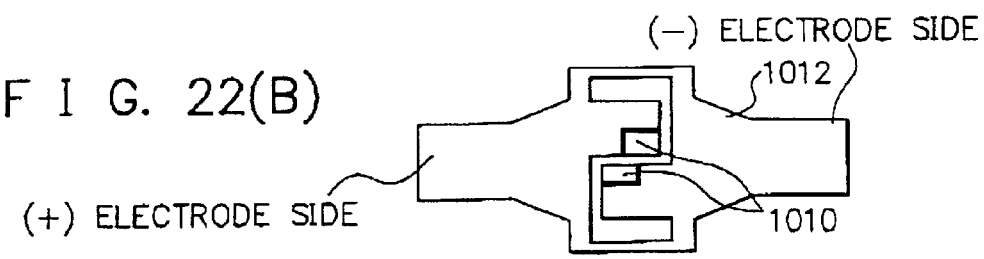
Figure 22C:
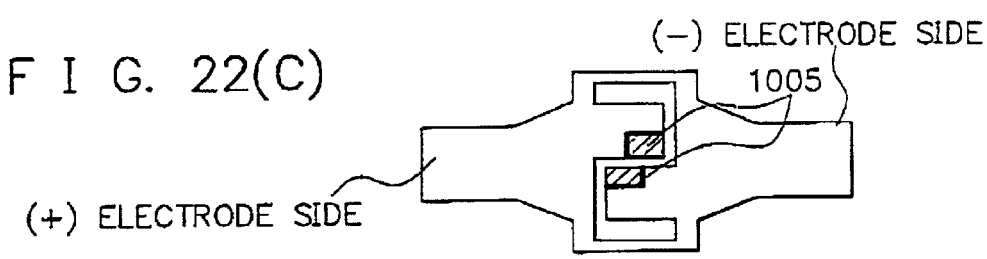
Figure 22D:
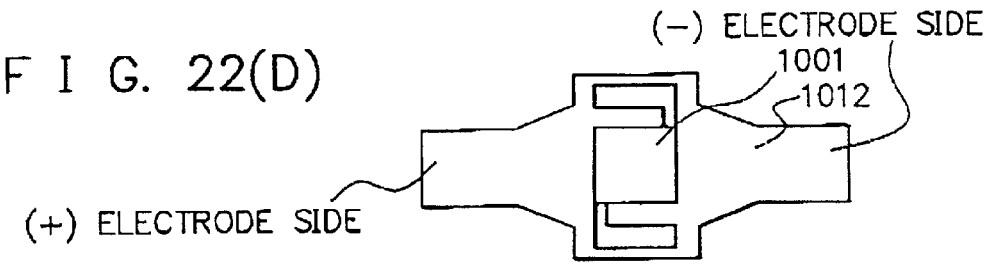

Step 1 [see, FIG. 22(A)]:

First, using an oxygen-free copper sheet having a thickness of 0.7 mm, there is formed a lead frame 1012 having a circuit pattern which has an electrode-joining portion for joining electrodes of a photovoltaic element 1001 [see, for instance, FIG. 22(D)] and an external terminal-fixing portion for fixing an external terminal by means of conventional technique such as press working. Said electrode-joining portion and said external terminal-fixing portion are integrated.

Step 2 [see, FIG. 22(B)]:

At a position in the vicinity of the electrode-joining portion of the circuit pattern of the lead frame 1012 where the electrodes of the photovoltaic element 1001 are to be joined, there is formed a square-shaped groove 1010 having a depth of 0.1 mm and a size of 0.8 mm×0.8 mm.

Step 3 [see, FIG. 22(C)]:

At a position in the vicinity of the electrode-joining portion of the circuit pattern of the lead frame 1012 where the electrodes of the photovoltaic element 1001 are to be joined, there is printed a cream solder 1005 (comprising a metal solder OZ63-381F4-9.5 having a Sn—Pb eutectic composition, produced by Senju Kinzokukogyo Kabushiki Kaisha) at a thickness of 120 m by a conventional screen printing method by means of a metal plate.

Step 4 [see, FIG. 22(D)]:

At a prescribed position on the lead frame 1012 where the cream solder 1005 is present, the photovoltaic element 1001 is arranged by means of a conventional chip mounter.

By heating then cooling the lead frame 1012 under condition of providing such temperature change profile with time elapse as shown in FIG. 19 by means of a conventional reflow apparatus, the cream solder 1005 is fused, followed by being solidified, whereby the photovoltaic element 1 can be surely mounted on the lead frame 1012.

At this time, because the groove 1010 is provided around the area where the electrodes of the semiconductor element are joined to the electrode-joining portion of the circuit pattern, the fused solder is prevented from issuing and as a result, the originally arranged position of the semiconductor element is maintained without being displaced due to the surface tension of the fused solder.

Figure 22E:
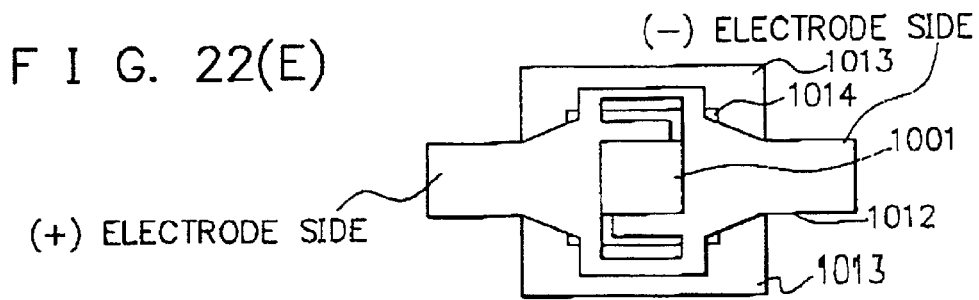

Step 5 [see, FIG. 22(E)]:

The lead frame having the photovoltaic element mounted thereon is laminated on a square-shaped support member 1013 comprising a tough pitch copper and having a thickness of 5 mm and a size of 25.4 mm×25.4 mm using a joining material 1014 comprising a square-shaped insulative double-coated adhesive sheet having a size of 15 mm×15 mm comprising an insulative double-coated adhesive sheet CHOMERICS T404, produced by Parker Hannifin Corp.). This support member is used to fix the lead frame to a heat sink (not shown in the figure) as a heat radiator, where the support member functions as a heat spreader to diffuse the heat of the photovoltaic element, which is generated when the photovoltaic element receives irradiation of converged and condensed sunlight, to the heat sink.

Figure 23A:
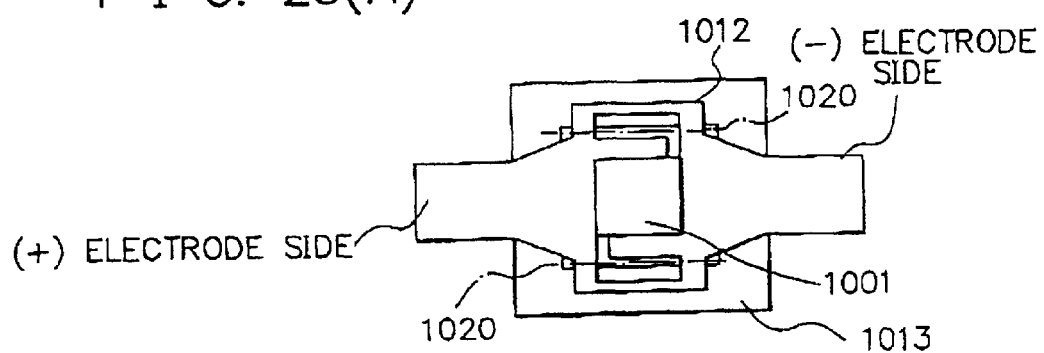
FIGS. 23(A) and 23(B) are schematic views for explaining a retaining substrate for mounting a semiconductor element thereon and a state after said semiconductor element is mounted on said retaining substrate in Example 8 which will be described later.
Figure 23B:
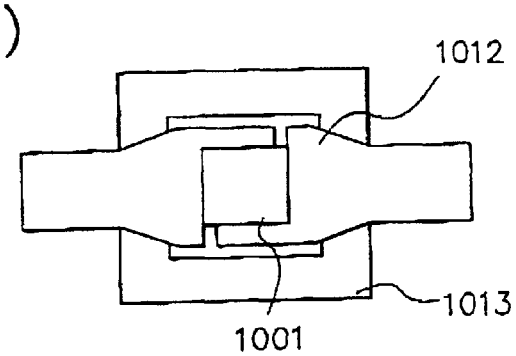

Further, if necessary, part of the lead frame indicated by cutting positions 1020 as shown in FIG. 23(A) is cut by means of a conventional cutting apparatus such as a diamond cutter. By doing in this way, it is possible to make the lead frame to be usable as a pair of power output electrodes [see, FIG. 23(B)].

As will be understood from the above description, the present invention provides such advantages as will be described below.

The present invention provides a semiconductor element-mounting substrate for mounting a semiconductor element thereon, said mounting substrate comprising a retaining substrate having a circuit pattern for said semiconductor element, said circuit pattern having an electrode-joining portion for joining power output electrodes of said semiconductor element and an external terminal-fixing portion for fixing an external terminal wherein said electrode-joining portion and said external terminal-fixing portion are electrically joined, and said electrode-joining portion and said external terminal-fixing portion are respectively electrically insulated, said electrode-joining portion being formed to be greater than an electrode portion of said semiconductor element, and a groove being provided between said electrode-joining portion and said external terminal-fixing portion.

Particularly, said mounting substrate comprising said retaining substrate and a lead frame joined to said retaining substrate, said lead frame having a circuit pattern for said semiconductor element, said circuit pattern having said electrode-joining portion where a pair of power output electrodes of said semiconductor element are joined and said external terminal-fixing portion which is electrically joined to said electrode-joining portion, said electrode-joining portion being formed to be greater than said electrode portion of said semiconductor element, and a groove being provided between said electrode-joining portion and said external terminal-fixing portion.

The semiconductor element-mounting substrate thus structured is greatly advantageous in that even when the semiconductor element mounted is a thin type photovoltaic element which is used under condition with irradiation of a highly condensed light, the mounting substrate makes it possible to desirably mount said photovoltaic element thereon without displacing the originally arranged position of said photovoltaic element and while preventing the cream solder material or/and the flux contained therein from depositing on the light receiving face of the photovoltaic element.

The groove of the circuit pattern is provided at least along the circumference of the portion where the semiconductor element is mounted and also at least along the electrode-joining portion. Because of this, when the cream solder material is fused, the residual of the solder material and that of the flux contained in the solder material are introduced into the groove. This makes it possible that the surface tension of the fused solder material which floats and retains the semiconductor element is properly controlled and the semiconductor element is accurately positioned at a prescribed position of the circuit pattern. Further, since the groove of the circuit pattern is provided at an end portion of the area where the power output electrodes are joined to the electrode-joining portion of the circuit pattern, it is possible that the residual of the flux contained in the solder material which will be deposited on the light receiving surface of the semiconductor element is escaped into the clearances of the circuit pattern.

What is claimed is:

1. A mounting structure in which a photovoltaic element is mounted together with a metal body for outputting a power generated by said photovoltaic element to the outside, said photovoltaic element having a light receiving face and a non-light receiving face and having a pair of electrodes on said non-light receiving face, said metal body having a first surface and a second surface opposite said first surface, wherein said photovoltaic element is joined to said first surface of said metal body and an electrically insulative joining material is joined to said second surface of said metal body, and wherein said electrically insulative joining material comprises an insulative double-coated adhesive sheet having heat conductivity.

2. A mounting structure according to claim 1, wherein said metal body comprises an electrically conductive metallic material principally comprising a metal selected from the group consisting of Au, Ag, Cu, Al, Ni, Fe, Co, W and an alloy thereof.

3. A mounting structure according to claim 1, wherein said metal body is shaped in a plate form having a thickness in a range of from 0.05 to 2 mm.

4. A mounting structure according to claim 1, wherein said metal body is shaped in a form capable of mounting a plurality of photovoltaic elements on an identical frame.

5. A mounting structure according to claim 1, wherein said photovoltaic element is electrically joined to said metal body through a joining material containing one or more metals selected from the group consisting of Sn, Pb, Ag, and Cu.

6. A mounting structure according to claim 1, wherein said electrically insulative joining material contains an adhesive material having heat conductivity.

7. A mounting structure according to claim 1, wherein a heat-radiating means is joined to the second surface of said metal body through said electrically insulative joining material.

8. A mounting structure according to claim 7, wherein said heat-radiating means has at least a flat face.

9. A mounting structure according to claim 7, wherein said heat-radiating means has a form capable of mounting at least two photovoltaic elements thereon.

10. A method for mounting a photovoltaic element, a metal body for outputting a power generated by said photovoltaic element to the outside, and a heat-radiating means for radiating heat generated in said photovoltaic element due to receipt of light irradiation, said photovoltaic element having a light receiving face and a non-light receiving face and having a pair of electrodes on said non-light receiving face, said metal body comprising a lead frame and having a first surface and a second surface opposite said first surface, said method including at least (a) a step of joining said photovoltaic element to a prescribed position on said first surface of said metal body by means of a joining material, said joining step further including a step of continuously supplying said lead frame and joining a plurality of photovoltaic elements to the lead frame continuously supplied at an equal interval and a step of cutting the lead frame having the plurality of photovoltaic elements joined thereto into individual frame units each having one of the photovoltaic elements; and (b) a step of joining said heat-radiating means to a prescribed position on said second surface of said metal body by means of an electrically insulative joining material.

11. The method according to claim 10, wherein said step (b) is performed after said step (a); said step (a) includes at least a step (a-i) of arranging said joining material at a prescribed position on the first surface of said metal body, a step (a-ii) of arranging said photovoltaic element at a prescribed position on the metal body where the joining material is arranged, and a step (a-iii) of heating said joining material to join said metal body and said photovoltaic element by the joining material; and said step (b) includes at least a step (b-i) of arranging said electrically insulative joining material at a prescribed position on said heat-radiating means, a step (b-ii) of arranging said metal body having said photovoltaic element joined thereto on said electrically insulative joining material arranged at the prescribed position on the heat-radiating means such that the second surface of the metal body is in contact with the electrically insulative joining material, and a step (b-iii) of pressing from above the front face of the photovoltaic element to join the metal body and the heat-radiating means through the electrically insulative joining material.

12. The method according to claim 11, wherein the step (b-iii) is performed using a pressing means comprising a structural body having a portion capable of being expanded by introducing air thereinto, wherein the pressing is performed by means of said expanded portion of said structural body.

13. The method according to claim 10, wherein the step (a) is performed after the step (b); the step (b) includes at least a step of joining the heat-radiating means onto the second surface of the metal body through the electrically insulative joining material; and the step (a) includes at least a step of arranging the joining material at a prescribed position on the first surface of the metal body, a step of arranging the photovoltaic element at a prescribed position on the metal body where the joining material is arranged, and a step of heating the joining material to join the metal body and the photovoltaic element by the joining material.

14. A semiconductor element-mounting substrate for mounting a semiconductor element thereon, said semiconductor element having an electrode portion, said mounting substrate comprising a retaining substrate having a circuit pattern for said semiconductor element, said circuit pattern having an electrode-joining portion for joining said electrode portion of said semiconductor element and an external terminal-fixing portion for fixing an external terminal wherein said electrode-joining portion and said external terminal-fixing portion are respectively electrically insulated, said electrode-joining portion being formed to be larger than said electrode portion of said semiconductor element, and said circuit pattern having a groove being provided between said electrode-joining portion and said external terminal-fixing portion.

15. A semiconductor element-mounting substrate according to claim 14, wherein the groove is provided at least along a circumference of a portion of the circuit pattern where the electrode portion of the semiconductor element is joined.

16. A semiconductor element-mounting substrate according to claim 14, wherein the groove is provided at least along the electrode-joining portion.

17. A semiconductor element-mounting substrate according to claim 14, wherein the groove is provided at least at an end portion of an area where the electrode portion of the semiconductor element is joined.

18. A semiconductor element-mounting substrate according to claim 14, wherein said semiconductor element-mounting substrate comprises a face having a support member and one or more circuit patterns.

19. A semiconductor element-mounting substrate according to claim 14, wherein the electrode portion of the photovoltaic element is joined to the electrode-joining portion of the circuit pattern using a joining material, and a joined portion comprising said joining material between said electrode portion and said electrode-joining portion has a thickness of more than $1/3$ of that of said photovoltaic element.

20. A semiconductor element-mounting substrate according to claim 19, wherein the joining material comprises a metallic material containing Sn or/and Pb.

21. A semiconductor element-mounting substrate for mounting a semiconductor element having an electrode portion, said mounting substrate comprising a retaining substrate and a lead frame joined to said retaining substrate, said lead frame having a circuit pattern for said semiconductor element, said circuit pattern having an electrode-joining portion for joining said electrode portion of said semiconductor element and an external terminal-fixing portion for fixing an external terminal, said electrode-joining portion being larger than said electrode portion of said semiconductor element, and said circuit pattern having a groove being provided between said electrode-joining portion and said external terminal-fixing portion.

22. A semiconductor element-mounting substrate according to claim 21, wherein said retaining substrate is provided with a heat-radiating means.

23. A method for mounting a semiconductor element having an electrode portion on a semiconductor element-mounting substrate comprising a retaining substrate and a lead frame joined to said retaining substrate, said lead frame having a circuit pattern for said semiconductor element, said circuit pattern having an electrode-joining portion for joining said electrode portion of said semiconductor element and an external terminal-fixing portion for fixing an external terminal, said electrode-joining portion being larger than said electrode portion of said semiconductor element, and said circuit pattern having a groove being provided between said electrode-joining portion and said external terminal-fixing portion, said method comprising the steps of:

(a) arranging a cream solder material at a prescribed position on said lead frame, (b) arranging said semiconductor element at a prescribed position on said lead frame where said cream solder material is arranged, (c) fusing said cream solder material to connect said electrode portion of said semiconductor element to said lead frame; and (d) joining the lead frame having the semiconductor element mounted thereon with said retaining substrate.

* * * * *

UNITED STATES PATENT AND TRADEMARK OFFICE
CERTIFICATE OF CORRECTION

PATENT NO. : 6,803,514 B2
DATED : October 12, 2004
INVENTOR(S) : Yoshifumi Takeyama It is certified that error appears in the above-identified patent and that said Letters Patent is hereby corrected as shown below:

Column 1,
Line 25, "to" should read -- due to --.
Line 42, "known have" should read -- known --.
Line 43, "using" should read -- used --.
Line 56, "in disclosed" should be deleted.
Line 57, "1996or" should read -- 1996 or --.

Column 2,
Line 6, "dreds" should read -- dred --.
Line 7, "whereby" should read -- thereby --.

Column 3,
Line 28, "of a" should read -- of --.

Column 4,
Line 13, "Su-Pb" should read -- Sn-Pb --.
Line 21, "Joining" should read -- joining --.
Line 32, "relationships.," should read -- relationships. --.
Line 36, "oxygen-tree" should read -- oxygen-free --.

Column 5,
Line 33, "has" should read -- has been --.
Line 45, "a time" should read -- time --.

Column 6,
Line 32, "here" should read -- there --.

Column 7,
Line 15, "mounting." should read -- mounting --.
Line 31, "enables" should read -- enables one --.
Line 38, "electrodes said" should read -- electrodes of said --.

Column 8,
Line 2, "the rein" should read -- therein --.
Line 12, "a fixing" should read -- fixing --.
Line 17, "grove" should read -- groove --.
Line 19, "port on;" should read -- portion; --.
Line 29, "re schematic" should read -- are schematic --.

UNITED STATES PATENT AND TRADEMARK OFFICE
CERTIFICATE OF CORRECTION

PATENT NO.    : 6,803,514 B2
DATED         : October 12, 2004
INVENTOR(S)   : Yoshifumi Takeyama It is certified that error appears in the above-identified patent and that said Letters Patent is hereby corrected as shown below:

Column 9,
Line 12, "a tic view" should read -- a schematic view --.
Line 31, "118(C)" should read -- 18(C) --.
Line 65, "semicon-" should read -- a semicon- --.

Column 10,
Line 53, "thin" should read -- this --.

Column 11,
Line 10, "out" should read -- cut -- and "each have" should read -- each having --.
Line 20, "land" should read -- and --.
Line 22, "Sn." should read -- Sn, --.

Column 12,
Line 16, "a d" should read -- and --.
Line 19, "enables" should read -- enables one --.
Line 29, "radiator joining" should read -- radiator-joining --.

Column 14,
Line 11, "Al." should read -- Al, --.
Line 13, "such" should read -- such as --.
Line 16, "and:" should read -- and --.
Line 60, "us" should read -- use --.
Line 67, "radiator" should read -- radiator. --.

Column 15,
Line 10, "requirement" should read -- requirements --.
Line 20, "mixtures" should read -- mixtures of --.
Line 43, "beat" should read -- heat --.

Column 16,
Line 20, "w" should be deleted.
Line 59, "instance" should read -- instance, --.

Column 17,
Line 3, "an dotting" should read -- as dotting --.
Line 34, "contains" should read -- containing --.
Line 61, "for a" should read -- for --.

UNITED STATES PATENT AND TRADEMARK OFFICE
CERTIFICATE OF CORRECTION

PATENT NO. : 6,803,514 B2
DATED : October 12, 2004
INVENTOR(S) : Yoshifumi Takeyama It is certified that error appears in the above-identified patent and that said Letters Patent is hereby corrected as shown below:

Column 18,
Line 1, "grove" should read -- groove --.
Line 63, "($Al^2O_3$)," should read -- ($Al_2O_3$), --.

Column 19,
Line 1, "in accordance" should be deleted.

Column 20,
Line 8, "electrode" should read -- electrodes --.
Line 24, "electrode joining" should read -- electrode-joining --.
Line 48, "such Cu." should read -- such as Cu, -- and "Mn." should read -- Mn, --.

Column 21,
Line 21, "2 mm×12 mm" should read -- 12 mm×12 mm --.
Line 27, "such" should read -- in such --.
Line 53, "120 m" should read -- 120 mm --.

Column 23,
Line 29, "sink" should read -- sink K4242-10B, produced by Asuka Denshi Service Kabushiki --.
Line 55, "amounting" should read -- mounting --.

Column 24,
Line 31, "120 m" should read -- 120 mm --.
Line 65, "7 S" should read -- 7 --.

Column 26,
Line 10, "circuit" should read -- a "circuit --.
Line 11, "zone." should read -- zone". --.
Line 24, "there" should read -- where --.

Column 28,
Line 28, "arranging" should read -- arranging 5 --.
Line 55, "improved," should read -- improved. --.

Column 30,
Line 4, "solder 105" should read -- solder 1005 --.
Line 36, "can" should read -- can be --.
Line 57, "A" should read -- a --.

UNITED STATES PATENT AND TRADEMARK OFFICE
CERTIFICATE OF CORRECTION

PATENT NO. : 6,803,514 B2
DATED : October 12, 2004
INVENTOR(S) : Yoshifumi Takeyama It is certified that error appears in the above-identified patent and that said Letters Patent is hereby corrected as shown below:

Column 31,
Line 7, "B." should read -- B, --.
Line 28, "transistor loll" should read -- transistor 1011 --.
Line 45, "can" should read -- can be --.
Line 48, "Joining" should read -- joining --.
Line 49, "Joined" should read -- joined --.

Column 32,
Line 44, "120 m" should read -- 120 mm --.

Column 33,
Line 3, "comprising" should read -- (comprising --.

Signed and Sealed this

Fourteenth Day of June, 2005

JON W. DUDAS
*Director of the United States Patent and Trademark Office*